(12) United States Patent
Park et al.

(10) Patent No.: US 10,325,972 B2
(45) Date of Patent: Jun. 18, 2019

(54) DISPLAY APPARATUS

(71) Applicant: SAMSUNG DISPLAY CO., LTD., Yongin-si, Gyeonggi-do (KR)

(72) Inventors: Hyungjun Park, Yongin-si (KR); Wonkyu Kwak, Yongin-si (KR); Yangwan Kim, Yongin-si (KR); Jaeyong Lee, Yongin-si (KR); Jintae Jeong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/870,438

(22) Filed: Jan. 12, 2018

(65) Prior Publication Data

US 2019/0096975 A1 Mar. 28, 2019

(30) Foreign Application Priority Data

Sep. 28, 2017 (KR) .................. 10-2017-0125789

(51) Int. Cl.
*H01L 27/32* (2006.01)
*H01L 33/56* (2010.01)
(Continued)

(52) U.S. Cl.
CPC ...... *H01L 27/3262* (2013.01); *H01L 27/3276* (2013.01); *H01L 33/56* (2013.01); *H01L 51/0097* (2013.01); *H01L 51/5253* (2013.01)

(58) Field of Classification Search
CPC ............. H01L 27/3262; H01L 51/0097; H01L 51/5253; H01L 33/56; H01L 27/3276
(Continued)

(56) References Cited

U.S. PATENT DOCUMENTS

2014/0197427 A1 7/2014 Kim
2016/0190389 A1\* 6/2016 Lee ..................... H01L 51/5256
257/93
(Continued)

FOREIGN PATENT DOCUMENTS

EP 3051333 A1 8/2016
EP 3217211 A2 9/2017
(Continued)

OTHER PUBLICATIONS

Extended European Search Report for Application No. 18174755.1 dated Jan. 7, 2019.

*Primary Examiner* — Fernando L Toledo
*Assistant Examiner* — Adam S Bowen
(74) *Attorney, Agent, or Firm* — Cantor Colburn LLP

(57) ABSTRACT

A display apparatus includes: a substrate including a display area and a non-display area surrounding the display area; a data wiring on the substrate in the display area; a connection wiring on the substrate in the non-display area and including a same material as the data line; an inorganic protective layer on the substrate covering the data line and extending to the non-display area; and an upper organic layer on the substrate covering the connection wiring and at least a portion of the inorganic protection layer, where the upper organic layer includes a first to third upper organic layers, and the second upper organic layer in a side of the upper organic layer adjacent to the display area is in direct contact with the inorganic protective layer, and the third upper organic layer exposes an end of the second upper organic layer in the side of the upper organic layer.

21 Claims, 11 Drawing Sheets

(51) Int. Cl.
*H01L 51/52* (2006.01)
*H01L 51/00* (2006.01)

(58) Field of Classification Search
USPC .......................................................... 257/88
See application file for complete search history.

(56) References Cited

U.S. PATENT DOCUMENTS

| | | |
|---|---|---|
| 2016/0218305 A1 | 7/2016 | Kim et al. |
| 2017/0148859 A1 | 5/2017 | Nishinohara |
| 2017/0262109 A1 | 9/2017 | Choi et al. |
| 2017/0263888 A1 | 9/2017 | Choi et al. |
| 2017/0271616 A1 | 9/2017 | Choi et al. |
| 2017/0278901 A1 | 9/2017 | Kim et al. |

FOREIGN PATENT DOCUMENTS

| | | |
|---|---|---|
| EP | 3217265 A1 | 9/2017 |
| EP | 3223324 A1 | 9/2017 |
| EP | 3223325 A1 | 9/2017 |
| KR | 1020170002782 A | 1/2017 |
| KR | 1020170059413 A | 5/2017 |
| KR | 1020170096089 A | 8/2017 |

* cited by examiner

DISPLAY APPARATUS

This application claims priority to Korean Patent Application No. 10-2017-0125789, filed on Sep. 28, 2017, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

A display apparatus is an apparatus for visually displaying data. Such a display apparatus typically includes a substrate divided into a display area and a non-display area. In the display apparatus, a gate line and a data line may be provided in the display area to be insulated from each other, and the gate line and the data line may intersect to define a plurality of pixel areas in the display area. In the display apparatus, a thin film transistor corresponding to each of the pixel areas, and a pixel electrode electrically connected to the thin film transistor may be provided in the display area. In the display apparatus, various wirings for transmitting electrical signals to the display area may be provided in the non-display area.

SUMMARY

As a display apparatus becomes thinner and more lightweighted, the display apparatus may be applied to more various technical fields. As the display apparatus is used in more various technical fields, it may be desired to modify the design of the display apparatus in various ways, including partial bending.

One or more embodiments include a display apparatus with improved interlayer adhesion between layers in a non-display area, while effectively protecting wirings therein.

According to one or more embodiments, a display apparatus includes: a substrate including a display area, in which a display device is disposed and an image is displayed, and a non-display area around the display area, where the non-display area including a bending area bending about a bending axis; a connection wiring on the substrate in the non-display area; a first wiring on the substrate in the display area, where the first wiring includes a same material as the connection wiring; an inorganic protective layer on the substrate covering the first wiring, where the inorganic protective layer includes an inorganic insulating material; and an upper organic layer on the substrate covering the bending area, where the upper organic layer includes a first upper organic layer, a second upper organic layer and a third upper organic layer which are sequentially stacked one on another. In such an embodiment, the second upper organic layer in a side of the upper organic layer, which is adjacent to the display area, is in direct contact with the inorganic protective layer, and the third upper organic layer exposes an end of the second upper organic layer in the side of the upper organic layer adjacent to the display area.

In an embodiment of the disclosure, a distance from the bending axis to the end of the second upper organic layer may be greater than a distance from the bending axis to an end of the first upper organic layer in the side of the upper organic layer adjacent to the display area, and may be greater than a distance from the bending axis to an end of the third upper organic layer in the side of the upper organic layer adjacent to the display area.

In an embodiment of the disclosure, the third upper organic layer may cover the second upper organic layer in another side of the upper organic layer, which is not adjacent to the display area.

In an embodiment of the disclosure, portions of the first upper organic layer, the second upper organic layer and the third upper organic layer in another side of the upper organic layer, which is not adjacent to the display area, are arranged in a stair shape with steps.

In an embodiment of the disclosure, the display apparatus further includes a top film on the substrate in the display area, where an end of the top film is on the upper organic layer.

In an embodiment of the disclosure, the inorganic protective layer may cover at least a portion of the connection wiring.

In an embodiment of the disclosure, the display apparatus further includes an inner wiring and an outer wiring, which are spaced apart from each other with the bending area therebetween; and an intermediate insulating layer on the inner wiring and the outer wiring. In such an embodiment, a first contact hole may be defined in the intermediate insulating layer, the connection wiring is on the intermediate insulating layer and is connected to the inner wiring and the outer wiring through the first contact hole, and the inorganic protective layer covers a portion of the connection wiring corresponding to the first contact hole.

In an embodiment of the disclosure, the display apparatus further includes an organic layer between the substrate and the connection wiring, where the inorganic protective layer may have a patterned shape corresponding to a shape of the connection wiring and exposes the organic layer.

In an embodiment of the disclosure, the display apparatus further includes: a thin film transistor on the substrate in the display area, where the thin film transistor includes a semiconductor layer, a gate electrode, a source electrode and a drain electrode; and a storage capacitor on the substrate overlapping the thin film transistor, where the storage capacitor includes a first storage capacitor plate and a second storage capacitor plate. In such an embodiment, the connection wiring and one of the source electrode and the drain electrode may be in a same layer as each other and include a same material as each other, and the inner wiring and at least one of the first storage capacitor plate and the second storage capacitor plate may be in a same layer as each other and include a same material as each other.

In an embodiment of the disclosure, the display apparatus further includes an additional connection wiring on the first upper organic layer, where an upper organic through-hole is defined in the first upper organic layer has to expose the connection wiring, and the additional connection wiring is connected to the connection wiring through the upper organic through-hole.

In an embodiment of the disclosure, at least a portion of the inorganic protective layer may be between the connection wiring and the additional connection wiring, where a second contact hole is defined in the inorganic protective layer to expose a portion of the connection wiring, and the connection wiring is connected to the additional connection wiring through the second contact hole.

In an embodiment of the disclosure, the display apparatus may include an inorganic insulating layer between the substrate and the connection wiring, where an opening or a groove is defined in a portion of the inorganic insulating layer corresponding to the bending area.

In an embodiment of the disclosure, the display apparatus further includes an organic layer between the substrate and the connection wiring in the bending area.

In an embodiment of the disclosure, the display apparatus further includes an encapsulation layer on the substrate in the display area, where the encapsulation layer includes a first inorganic encapsulation layer, an organic encapsulation layer and a second inorganic encapsulation layer, which are sequentially stacked one on another, and the first inorganic encapsulation layer and the second inorganic encapsulation layer extend into the non-display area and contact the upper organic layer.

In an embodiment of the disclosure, the display apparatus further includes a bending protection layer on the upper organic layer in the bending area.

According to one or more embodiments, a display apparatus includes: a substrate including a display area, in which pixels are disposed and an image is displayed, and a non-display area surrounding the display area; a data wiring on the substrate in the display area; a connection wiring on the substrate in the non-display area, where the connection wiring includes a same material as the data line; an inorganic protective layer on the substrate covering the data line and extending to the non-display area; and an upper organic layer on the substrate covering the connection wiring and at least a portion of the inorganic protection layer. In such an embodiment, the upper organic layer includes a first upper organic layer, a second upper organic layer and a third upper organic layer, which are sequentially stacked one on another, the second upper organic layer in a side of the upper organic layer, which is adjacent to the display area, is in direct contact with the inorganic protective layer, and the third upper organic layer exposes an end of the second upper organic layer in the side of the upper organic layer adjacent to the display area.

In an embodiment of the disclosure, the display apparatus further includes an inner wiring and an outer wiring which are spaced apart from each other in the non-display area; an intermediate insulating layer on the inner wiring and the outer wiring, where a first contact hole is defined in the intermediate insulating layer, and the connection wiring is connected to the inner wiring or the outer wiring through the first contact hole.

In an embodiment of the disclosure, the connection wiring electrically may connect the inner wiring with the outer wiring.

In an embodiment of the disclosure, the inorganic protective layer may cover at least a portion of the first contact hole.

In an embodiment of the disclosure, the connection wiring may overlap at least one of the inner wiring and the outer wiring, and have an island shape.

In an embodiment of the disclosure, the display apparatus further includes an additional connection wiring on the inorganic protective layer, where a second contact hole is defined in a portion of the inorganic protective layer, the second contact hole corresponding to the connection wiring, and the additional connection wiring is connected to the connection wiring through the second contact hole.

Other features and characteristics other than those mentioned above will be clarified in view of the accompanying drawings, detailed descriptions thereof, and claims.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
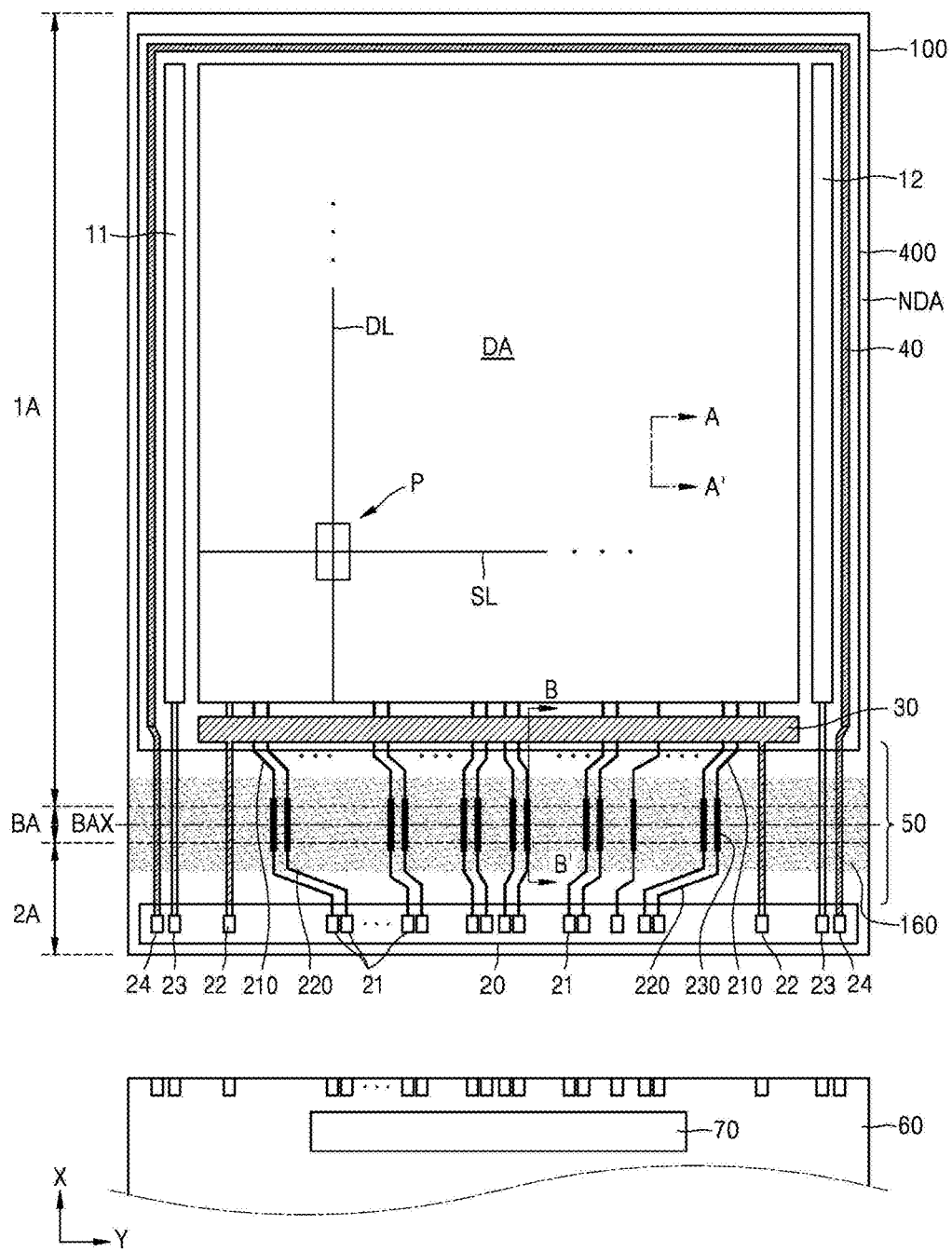
FIG. 1 shows a schematic plan view of a display apparatus according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

In the following embodiments, an X-axis, a Y-axis and a Z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Herein, a display apparatus may be an apparatus for displaying an image, and may be a liquid crystal display, an electrophoretic display, an organic light emitting display, an inorganic light emitting display, a field emission display, a surface-conduction electron-emitter display, a plasma display, a cathode ray display, or the like.

Hereinafter, for convenience of description, embodiments where a display apparatus is an organic light-emitting display apparatus will be described in detail with reference to the accompanying drawings. However, embodiments of a display apparatus according to the invention are not limited thereto, and various other types of display apparatuses may be used.

Figure 2:
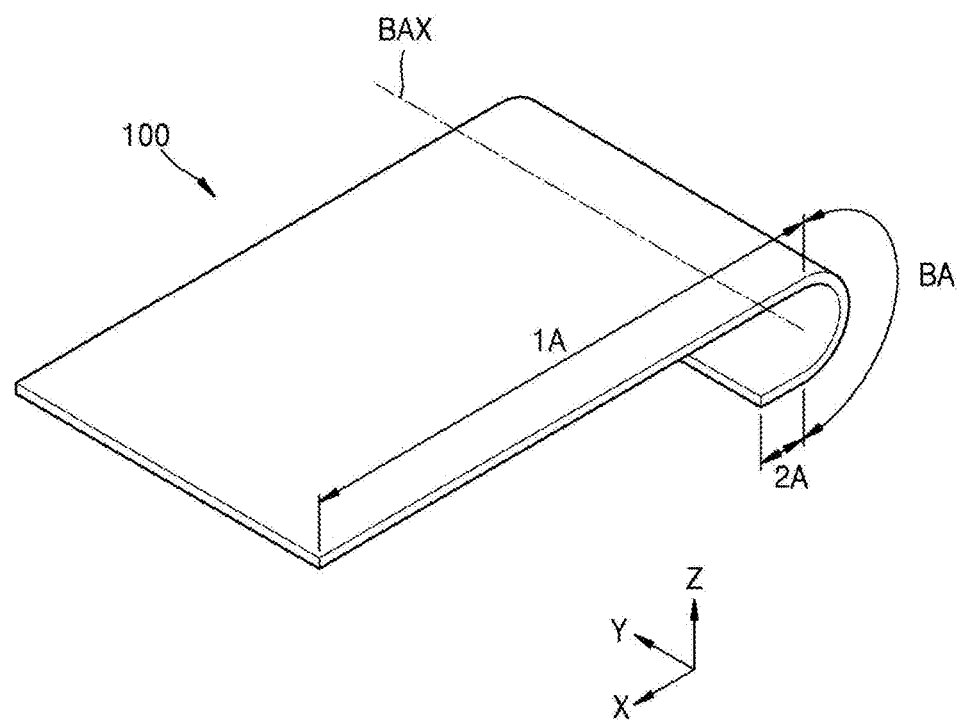
FIG. 2 shows a schematic perspective view of a portion of a display apparatus according to an embodiment of the disclosure.

FIG. 1 shows a schematic plan view of a display apparatus according to an embodiment of the disclosure, and FIG. 2 shows a schematic perspective view of a portion of a display apparatus according to an embodiment of the disclosure.

Referring to FIGS. 1 and 2, in an embodiment of the display apparatus, a substrate 100 may have a bending area BA extending in a first direction (or a Y-axis direction). The bending area BA may be located between a first area 1A and a second area 2A along a second direction (or an X-axis direction) that intersects the first direction.

Although embodiments of the disclosure are described based on a bent display apparatus, embodiments of the disclosure are not limited to a display apparatus that is bent due to the inclusion of the bending area BA.

The substrate 100 may be bent about a bending axis BAX extending in the first direction. Referring to FIG. 2, the substrate 100 is bent with a constant radius of curvature with respect to the bending axis BAX, but the disclosure is not limited thereto. In an alternative embodiment, the substrate 100 may be bent around the bending axis BAX, but the radius of curvature thereof may not be constant.

The substrate 100 may include at least one of various materials having flexible or bendable properties, and may include least one of polyethersulphone ("PES"), polyacrylate ("PAR"), polyetherimide ("PEI"), polyethylene naphthalate ("PEN"), polyethyleneterephthalate ("PET"), polyphenylene sulfide ("PPS"), polyallylate, polyimide ("PI"), polycarbonate ("PC") or cellulose acetate propionate ("CAP"), for example. The substrate 100 may have a single- or multi-layered structure including such materials. In an embodiment, where the substrate 100 has a multi-layer structure, the substrate 100 may further include an inorganic layer (not shown).

The first area 1A may include a display area DA. The first area 1A may be defined by, as illustrated in FIG. 1, the display area DA and a portion of a non-display area NDA outside the display area DA. The second area 2A and the bending area BA may each be defined by a portion of the non-display area NDA. The display area DA of the display apparatus constitutes a portion of the first area 1A, and the non-display area NDA includes the other portion of the first area 1A, the second area 2A and the bending area BA.

The display area DA includes pixels P, and may display an image. Each of the pixels P may be connected to a signal line, such as a scan line SL extending in the first direction or a data line DL extending in the second direction. Although not shown in FIG. 1, the pixels P may be connected to a power line for transmitting direct current ("DC") signals, such as a driving power line or a common power line.

The pixels P may include electronic elements, such as a thin film transistor ("TFT") and a storage capacitor, electrically connected to the signal line and the power line and an organic light-emitting device ("OLED") connected to the electronic elements. The pixels P may emit, for example, a red light, a green light, a blue light or a white light through the OLED. Herein, the pixels P may each be a sub-pixel that emit light of one of a red color, a green color, and a blue color as described above, or a sub-pixel that emit light of any one of a red color, a green color, a blue color, and a white color. The display area DA may be covered by an encapsulation layer 400, and may be protected from external gas or moisture. In an embodiment, where a display device or element included in each of the pixels P is an OLED, the TFT may include a driving TFT and a switching TFT, and the TFT may further include an additional TFT based on the design of the pixels P.

The display apparatus may include first and second scan driving units 11 and 12, a terminal unit 20, a driving voltage supply line 30, a common voltage supply line 40, and an interconnection unit 50 in the non-display area NDA.

The first and second scan driving units 11 and 12 may be disposed in the first area 1A. In an embodiment, the first and second scan driving units 11 and 12 may be spaced apart from each other with the display area DA therebetween. The first and second scan driving units 11 and 12 may each generate and transmit a scan signal to each of the pixels P through the scan line SL. According to an embodiment, as illustrated in FIG. 1, the display apparatus includes two scan driving units. However, the disclosure is not limited thereto. In an alternative embodiment, the display apparatus includes a single scan driving unit disposed on one side of the display area DA.

The terminal unit 20 may be disposed on an end of the non-display area NDA, and may include terminals 21, 22, 23, and 24. The terminal unit 20 may be exposed without being covered by an insulating layer and may be connected to a flexible film 60, such as a flexible printed circuit board including a driver IC 70. FIG. 1 shows an embodiment of a chip-on-film ("COF") type in which the driver IC 70 is connected through the flexible film 60, but the disclosure is not limited thereto. In an alternative embodiment, the driver IC 70 may be immediately on the terminal unit 20 of the substrate 100, which is the type of a chip-on-panel ("COP").

The driving voltage supply line 30 may provide a driving voltage ELVDD to the pixels P. The driving voltage supply line 30 may be adjacent to a side of the display area DA in the non-display area NDA.

The common voltage supply line 40 may provide a common voltage ELVSS to the pixels P. The common voltage supply line 40 may surround a portion of the display area DA in the non-display area NDA.

The interconnection unit 50 may include inner wirings 210 in the first area 1A, outer wirings 220 in the second area 2A, and connection wirings 230 which are bridge wirings that electrically connect the inner wirings 210 with the outer wirings 220. Each of the inner wirings 210 may be electrically connected to a signal line of the display area DA, and each of the outer wirings 220 may be electrically connected to the terminal unit 20 of the non-display area NDA.

Figure 3:
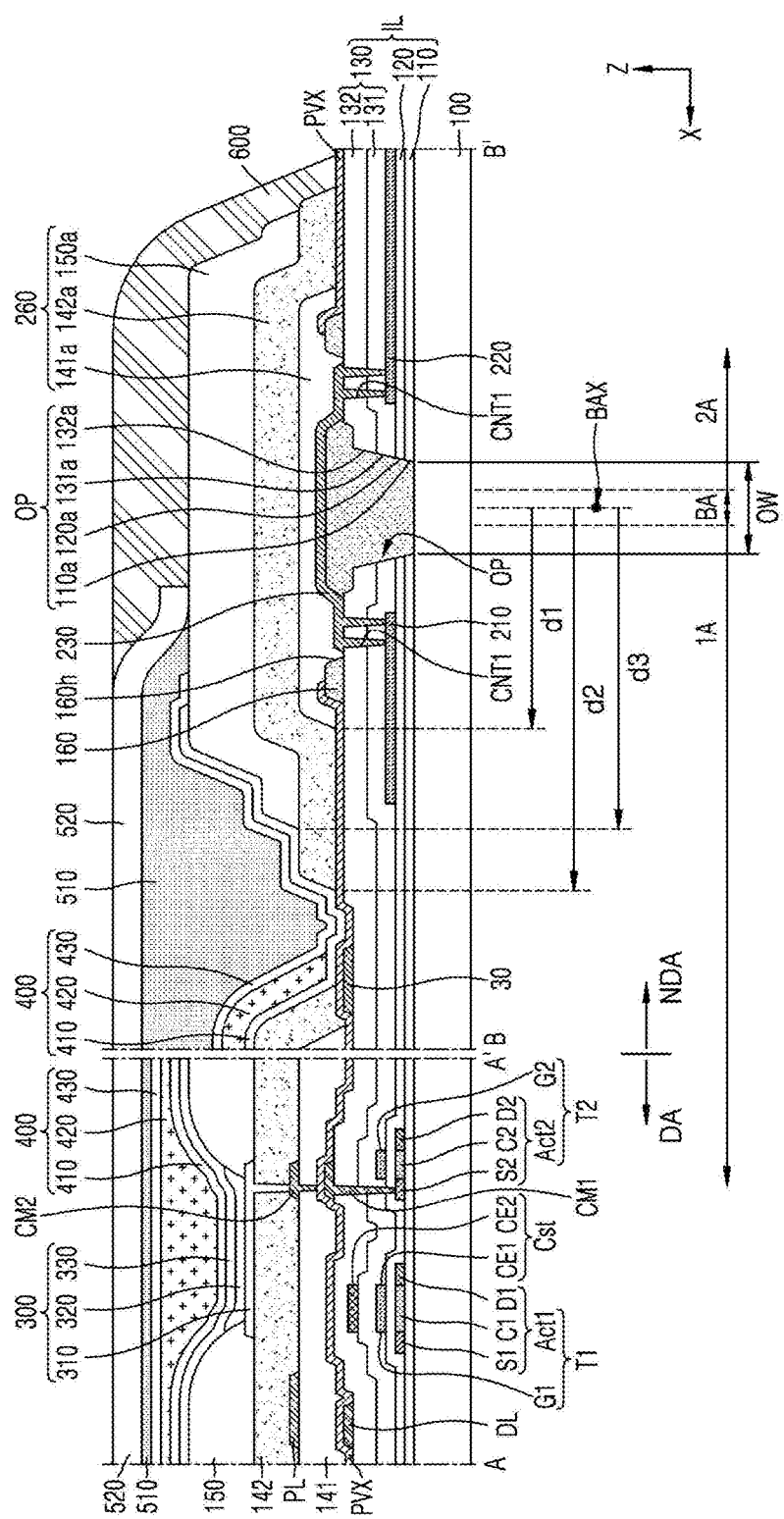
FIG. 3 shows a cross-sectional view of a display apparatus according to an embodiment of the disclosure.

The connection wirings 230 may extend from the first area 1A to the second area 2A through the bending area BA. The connection wirings 230 may each intersect the bending axis BAX described above with reference to FIG. 2. In an embodiment, as shown in FIG. 3, the connection wirings 230, which are bridge wirings, extend perpendicular to the bending axis BAX, but the disclosure is not limited thereto. In an alternative embodiment, the connection wirings 230 may extend diagonally to have a predetermined angle with respect to the bending axis BAX, or may have various shapes such as a curved shape or a zigzag shape that are not linear shapes.

An organic layer 160 may be on at least the bending area BA. The organic layer 160 overlaps the connection wirings 230, and one side of the organic layer 160 may extend over the first area 1A and the other side thereof may extend over the second area 2A. In an embodiment, the organic layer 160 may be disposed under the connection wiring 230, for example, between the substrate 100 and the connection wirings 230, and may surround a contact portion between the connection wirings 230 and the inner wirings 210 and a contact portion between the connection wirings 230 and the outer wiring 220.

FIG. 3 shows a cross-sectional view of a display apparatus according to an embodiment of the disclosure, and the cross-section of FIG. 3 is taken along line A-A' and line B-B' of FIG. 1.

Referring to FIG. 3, an OLED 300, which a display device or element of the display apparatus, may be located in the display area DA. The OLED 300 may be electrically connected to first and second TFTs T1 and T2 and a storage capacitor Cst. The first TFT T1 includes a first semiconductor layer Act1 and a first gate electrode G1, and the second TFT T2 includes a second semiconductor layer Act2 and a second gate electrode G2.

The first semiconductor layer Act1 and the second semiconductor layer Act2 may each include an amorphous silicon, a polycrystalline silicon, an oxide semiconductor, or an organic semiconductor material. The first semiconductor layer Act1 may include a channel area C1, and a source area S1 and a drain area D1, which are spaced apart from each other with the channel area C1 therebetween, and the second semiconductor layer Act2 may include a channel area C2, and a source area S2 and a drain area D2, which are spaced apart from each other with the channel area C2 therebetween. The source areas S1 and S2 and drain areas D1 and D2 of the first and second semiconductor layers Act1 and Act2 may define a source electrode and a drain electrode of the first and second TFTs T1 and T2, respectively.

The first gate electrode G1 and the channel area C1 of the first semiconductor layer Act1 overlap each other with a gate insulating layer 120 therebetween, and the second gate electrode G2 and the channel area C2 of the second semiconductor layer Act2 overlap each other with the gate insulating layer 120 therebetween. Herein, two elements overlapping each other may overlap each other in a thickness direction of the substrate 100. The first and second gate electrodes G1 and G2 may each be a single- or multi-film including a conductive material including at least one selected from molybdenum (Mo), aluminum (Al), copper (Cu), and titanium. Herein, a single-film may means a film or layer having a single-layer structure, and a multi-film may means a film having a multi-layer structure. In an embodiment, as shown in FIG. 3, the first gate electrode G1 and the second gate electrode G2 are located in a same layer as each other, but the disclosure is not limited thereto. In an alternative embodiment, the first gate electrode G1 and the second gate electrode G2 may be located in different layers from each other. Herein, when two layers are in a same layer as each other, layers immediately therebelow are the same as each other. In an embodiment, as shown in FIG. 3, the first and second TFTs T1 and T2 are each of a top-gate type in which the first gate electrode G1 and the second gate electrode G2 are respectively located on the first semiconductor layer Act1 and the second semiconductor layer Act2. In an alternative embodiment, the first and second TFTs T1 and T2 may be of a bottom-gate type in which the first gate electrode G1 and the second gate electrode G2 are respectively located under the first semiconductor layer Act1 and the second semiconductor layer Act2.

The storage capacitor Cst may include a first storage capacitor plate CE1 and a second storage capacitor plate CE2 which overlap each other. The first and second storage capacitor plates CE1 and CE2 may each include a low-resistance conductive material including at least one selected from molybdenum (Mo), aluminum (Al), copper (Cu), and titanium (Ti).

The storage capacitor Cst and the first TFT T1 may overlap, and the first TFT T1 may be a driving TFT. In an embodiment, as shown in FIG. 3, the storage capacitor Cst and the first TFT T1 overlap, and the first storage capacitor plate CE1 is the first gate electrode G1 of the first TFT T1. However, the disclosure is not limited thereto. In an alternative embodiment, the storage capacitor Cst does not overlap the first TFT T1.

A buffer layer 110 may be between the substrate 100 and the first and second TFTs T1 and T2. The buffer layer 110 may include an inorganic insulating material. In one embodiment, for example, the buffer layer 110 may be a single- or multi-film including at least one selected from silicon oxynitride (SiON), silicon oxide (SiOx), and silicon nitride (SiNx).

The gate insulating layer 120 may be between the first and second gate electrodes G1 and G2 and the first and second semiconductor layers Act1 and Act2. The gate insulating layer 120 may include an inorganic insulating material. In an embodiment, the gate insulating layer 120 may be a single- or multi-film including at least one selected from silicon oxynitride (SiON), silicon oxide (SiOx), and silicon nitride (SiNx).

The first and second TFTs T1 and T2 may be covered by an interlayer insulating layer 130. In an embodiment, as shown in FIG. 3, the interlayer insulating layer 130 includes first and second interlayer insulating layers 131 and 132.

The first interlayer insulating layer 131 may be located directly on the first and second TFTs T1 and T2 and/or directly on the first storage capacitor plate CE1. The first interlayer insulating layer 131 may be located between the first storage capacitor plate CE1 and the second storage capacitor plate CE2. The second interlayer insulating layer 132 may be located on the second storage capacitor plate CE2.

In an embodiment, each of the first interlayer insulating layer 131 and the second interlayer insulating layer 132 may be a single- or multi-film including at least one selected from silicon oxynitride (SiON), silicon oxide (SiOx), and silicon nitride (SiNx). In one embodiment, for example, the first interlayer insulating layer 131 may be a single film including silicon nitride (SiNx), and the second interlayer insulating layer 132 may be a multi-film including silicon nitride (SiNx) and silicon oxide (SiOx). Herein, an interlayer insulating layer refers to an insulating layer between the inner wirings 210 and the connection wirings 230 and/or between the outer wirings 220 and the connection wirings 230, and may be understood as the first interlayer insulating layer 131, the second interlayer insulating layer 132, or the combination of the first interlayer insulating layer 131 and the second interlayer insulating layer 132.

The data line DL may be located on the interlayer insulating layer 130. The data line DL may be electrically connected to a switching TFT (not shown) to provide a data signal. The data line DL may be a single- or multi-film including at least one of aluminum (Al), copper (Cu), titanium (Ti), and a combination (e.g., an alloy) thereof. In one embodiment, for example, the data line DL may be a three-layer film having the structure of Ti/Al/Ti.

The data line DL may be covered by an inorganic protective layer PVX. The inorganic protective layer PVX may be a single- or multi-film including silicon nitride (SiNx) and silicon oxide (SiOx). Although not shown, the inorganic protective layer PVX may cover and protect some of exposed wirings in the non-display area NDA. In a portion of the substrate 100, for example, a portion of a non-display area, wirings (not shown) formed together with the data line DL during a same process may be exposed. The exposed wirings may be damaged by an etchant which is used in patterning a pixel electrode 310. However, in an embodiment, since the inorganic protective layer PVX covers the data line DL and at least a portion of the wirings formed together with the data line DL, the damage on the wirings during the patterning process for the pixel electrode 310 may be effectively prevented.

The driving voltage line PL and the data line DL may be located in different layers from each other. The term "A and B are in different layers" used herein refers to a case where at least one insulating layer is between A and B, that is, one of A and B is under the at least one insulating layer and the other of A and B is located on the at least one insulating layer. A first planarization insulating layer 141 may be between the driving voltage line PL and the data line DL.

The driving voltage line PL may be a single- or multi-film including at least one selected from aluminum (Al), copper (Cu), titanium (Ti), and a combination thereof. In one embodiment, for example, the driving voltage line PL may be a three-layer film having the structure of Ti/Al/Ti. In an embodiment, as shown in FIG. 3, the driving voltage line PL is located only on the first planarization insulating layer 141, but the disclosure is not limited. In an alternative embodiment, the driving voltage line PL may be connected to a lower additional voltage line (not shown) formed together with the data line DL through a through-hole (not shown) defined in the first planarization insulating layer 141 to reduce a resistance.

A second planarization insulating layer 142 may cover the driving voltage line PL. The first and second planarization insulating layers 141 and 142 may each include an organic material. The organic material may include a general polymer, such as an imide polymer, polymethylmethacrylate ("PMMA"), and polystyrene ("PS"), a polymer derivative having a phenolic group, an acrylic polymer, an arylether polymer, an amide polymer, a fluorine polymer, a p-xylene polymer, a vinyl alcohol-based polymer, or a combination (e.g., a blend) thereof.

The OLED 300 may be on the second planarization insulating layer 142. The OLED 300 includes the pixel electrode 310, an opposite electrode 330, and an intermediate layer 320 between the pixel electrode 310 and the opposite electrode 330, where the intermediate layer 320 includes an emission layer.

A pixel defining layer 150 may be located on the pixel electrode 310. In an embodiment, an opening corresponding to each sub-pixel, that is, an opening exposing a central portion of the pixel electrode 310, is defined through the pixel defining layer 150 to define a pixel. In such an embodiment, the pixel defining layer 150 may increase the distance between an edge of the pixel electrode 310 and the opposite electrode 330, thereby effectively preventing the occurrence of an arc or the like therebetween. The pixel defining layer 150 may include an organic material, such as PI or hexamethyldisiloxane ("HMDSO").

A spacer (not shown) may be disposed above the pixel defining layer 150. The spacer may prevent the formation of a pressing mark by a mask, the pressing mark that may occur during a mask process for forming the intermediate layer 320 of the OLED 300 and the like. The spacer may include an organic material such as PI or HMDSO. In an embodiment, the spacer may be formed by using a same material as that used to form the pixel defining layer 150. In such an embodiment, a halftone mask may be used to form the spacer and the pixel defining layer 150.

The pixel electrode 310 may be electrically connected to a pixel circuit, for example, a pixel circuit including the first and second TFTs T1 and T2 and the storage capacitor Cst through first and second connection metals CM1 and CM2. The first connection metal CM1 and the data line DL may be in a same layer as each other, and the second connection metal CM2 and the driving voltage line PL may be in a same layer as each other.

The intermediate layer 320 may include a low molecular material or a polymer material. In an embodiment, where the intermediate layer 320 includes a low molecular material, the intermediate layer 320 may have a stack structure including a hole injection layer ("HIL"), a hole transport layer ("HTL"), an emission layer ("EML"), an electron transport layer ("ETL"), and an electron injection layer ("EIL"), each of which may have a single-layer structure or a multi-layer structure. The intermediate layer 320 may include at least one of various organic materials, such as copper phthalocyanine ("CuPc"), N,N'-di(naphthalene-1-yl)-N,N'-diphenyl-benzidine ("NPB"), tris-8-hydroxyquinoline aluminum ("Alq3"), or the like. Such layers may be formed by a vacuum deposition.

In an embodiment, where the intermediate layer 320 includes a polymer, the intermediate layer 320 may include an HTL and an EML. In such an embodiment, the HTL may include PEDOT, and the EML may include a polymer such as poly-phenylenevinylene ("PPV") and polyfluorene. However, the intermediate layer 320 is not limited to these structures, but may have one of various other structures. In one embodiment, for example, the intermediate layer 320 may include a common layer over a plurality of pixel electrodes, or may include a patterned layer corresponding to each of the pixel electrodes 310.

The opposite electrode 330 may be located to cover the display area DA. In an embodiment, the opposite electrode 330 may be a common layer covering a plurality of OLEDs 300.

Since the OLED 300 may be easily damaged by moisture or oxygen from the outside, the OLED 300 may be covered by the encapsulation layer 400. The encapsulation layer 400 covers the display area DA and a portion thereof may extend outside the display area DA. The encapsulation layer 400 may include an inorganic insulating layer and an organic insulating layer. In one embodiment, for example, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and may include silicon oxide (SiOx), silicon nitride (SiNx), and/or oxynitride silicon (SiON). Although not shown, in an alternative embodiment, other layers, such as a capping layer, may be between the first inorganic encapsulation layer 410 and the opposite electrode 330. Since the first inorganic encapsulation layer 410 conforms to the underlying structure thereof, the first inorganic encapsulation layer 410 may not have a flat top surface. A top surface of the organic encapsulation layer 420 covering the first inorganic encapsulation layer 410 may have at least a flat portion corresponding to the display area DA. The organic encapsulation layer 420 may include at least one material selected from polyethylene terephthalate, PEN, PC, PI, polyethylene sulfonate, polyoxymethylene, polyarylate, and HMDSO. The second inorganic encapsulation layer 430 may cover the organic encapsulation layer 420 and may include silicon oxide (SiOx), silicon nitride (SiNx), and/or oxynitride silicon (SiON).

A top film 520 may be located on the encapsulation layer 400 by an optically clear adhesive OCA 510. The top film 520 may be a polarizing film, a color filter, a touch film, a window film, or the like, each of which is separately manufactured and then provided on the encapsulation layer 400.

In such an embodiment, the polarizing film may reduce the reflection of external light and improve the visibility. The color filter may clarify emission color and reduce the reflection of external light due to the inclusion of a matrix of a color corresponding to the color of each pixel and a black matrix. The touch film may be a layer including a touch electrode and may sense external contact. The window film may be a transparent film and protect a display apparatus. In such an embodiment, various functional layers other than the films described above may be used as the top film 520. The top film 520 may be attached on the encapsulation layer 400 in such a way that the top film 520 is positioned at an end of the non-display area NDA, and pressed from the end to the center of the display area DA by a roller or the like.

Referring to the non-display area NDA and the bending area BA illustrated in FIG. 3, an upper organic layer 260 is in contact with the inorganic protective layer PVX in the non-display area NDA.

The inorganic protective layer PVX may cover and protect some wirings (for example, the driving supply voltage line 30, etc.) exposed in the non-display area NDA and may be in contact with the upper organic layer 260.

The upper organic layer 260 may function as a member for supporting an open mask used when a member covering the entire surface of the display area DA is formed. In one embodiment, for example, the upper organic layer 260 may support an open mask that is used to form the opposite electrode 330, the first inorganic encapsulation layer 410, or the second inorganic encapsulation layer 430. When the organic encapsulation layer 420 of the encapsulation layer 400 is formed, the upper organic layer 260 may function as a dam to prevent an organic material constituting the organic encapsulation layer 420 from flowing over into the outside before being cured. The upper organic layer 260 may control a stress neutral plane together with a bending protection layer 600, which will be described later, in the bending area BA.

The upper organic layer 260 may include a first upper organic layer 141a, a second upper organic layer 142a, and a third upper organic layer 150a, which are sequentially stacked in this stated order. The upper organic layer 260 may be physically separated (or spaced apart) from a layer including an organic material located in the display area DA. In one embodiment, for example, the upper organic layer 260 may be physically separated from the organic encapsulation layer 420 of the encapsulation layer 400. In such an embodiment, the first inorganic encapsulation layer 410 is located between the upper organic layer 260 and the organic encapsulation layer 420 such that impurities are effectively prevented from penetrating from the outside to reach the interior of the display area DA along an organic layer. In such an embodiment, the upper organic layer 260 is physically spaced from the first planarization insulating layer 141, the second planarization insulating layer 142, and the pixel defining layer 150.

The first upper organic layer 141a may be formed by using a same material as used to form the first planarization insulating layer 141, and may be spaced apart from the first planarization insulating layer 141. The second upper organic layer 142a and the second planarization insulating layer 142 may be formed by using a same material as each other during a same process, and the second upper organic layer 142a may be spaced apart from the second planarization insulating layer 142. The third upper organic layer 150a may be formed by using a same material as used to form the pixel defining layer 150 and may be spaced apart from the pixel defining layer 150.

The first upper organic layer 141a and the second upper organic layer 142a may each include a polymer, such as an imide polymer, PMMA, and PS, a polymer derivative having a phenolic group, an acrylic polymer, an arylether polymer, an amide polymer, a fluorine polymer, a p-xylene polymer, a vinyl alcohol-based polymer, or a combination (e.g., a blend) thereof. The third upper organic layer 150a may include an organic material, such as PI or HMDSO.

The first inorganic encapsulation layer 410 and the second inorganic encapsulation layer 430 each extend on an upper surface of the upper organic layer 260. In one or more embodiments, the first inorganic encapsulation layer 410 and the second inorganic encapsulation layer 430 are not on the upper surface of the upper organic layer 260, but on a portion of a side surface of the upper organic layer 260. In one or more embodiments, the first inorganic encapsulation layer 410 and the second inorganic encapsulation layer 430 may each be physically separated from the upper organic layer 260.

In an embodiment, the end of the top film 520 may be positioned on the upper organic layer 260, and to attach the top film 520 on the encapsulation layer 400, the top film 520 may be pressed on the upper organic layer 260 by using a pressing member such as a roller. In such an embodiment, when the adhesion between the upper organic layer 260 and the inorganic protective layer PVX located thereunder is weak, the upper organic layer 260 may be separated from the inorganic protective layer PVX.

In an embodiment, the upper organic layer 260 has a structure with improved adhesion with respect to the inorganic protective layer PVX. In such an embodiment, as shown, the upper organic layer 260 includes the first upper organic layer 141a, the second upper organic layer 142a and the third upper organic layer 150a, which are sequentially stacked in this stated order, and in an edge of the upper organic layer 260 between the display area DA and the bending area BA, the second upper organic layer 142a is in direct contact with the inorganic protective layer PVX. However, in such an embodiment, the third upper organic layer 150a is not in direct contact with the inorganic protective layer PVX.

In a side of the upper organic layer 260 that is adjacent to the display area DA, e.g., a side of the upper organic layer 260 between the display area DA and the bending area BA, the second upper organic layer 142a is in direct contact with the inorganic protective layer PVX, and the third upper organic layer 150a exposes the end of the second upper organic layer 142a. The second upper organic layer 142a covers an end of the first upper organic layer 141a, and may extend long in a direction (X direction) to increase a contact area with respect to the inorganic protective layer PVX.

This will be described based on the bending axis BAX, in greater detail, the X direction (toward the display area) from the bending axis BAX. A distance d2 from the bending axis BAX to the end of the second upper organic layer 142a is greater than a distance d1 from the bending axis BAX to the end of the first upper organic layer 141a and a distance d3 from the bending axis BAX to the third upper organic layer 150a.

Referring to FIG. 3, this will be described based on the width in the X direction. In an embodiment, an X-direction width of the second upper organic layer 142a is greater than an X-direction width of the first upper organic layer 141a and an X-direction width of the third upper organic layer 150a.

In such an embodiment, even in another side of the upper organic layer 260 that is not adjacent to the display area DA, e.g., a side of the upper organic layer 260 opposite to the side adjacent to the display area DA, * the second upper organic layer 142a is in direct contact with the inorganic protective layer PVX, and the third upper organic layer 150a exposes an end of the second upper organic layer 142a.

Accordingly, in such an embodiment, the adhesion between the upper organic layer 260 and the inorganic protective layer PVX may be improved at the side of the upper organic layer 260 that is adjacent to the display area DA and even at the side of the upper organic layer 260 that is not adjacent to the display area DA.

In such an embodiment, the upper organic layer 260 has the structure descried above because the adhesion between the second upper organic layer 142a and the inorganic protective layer PVX is greater than the adhesion between the first upper organic layer 141a and the inorganic protective layer PVX, and the adhesion between the third upper organic layer 150a and the inorganic protective layer PVX. This may be due to the change in physical properties of the interface of the inorganic protective layer PVX in the processes.

In an embodiment, the first planarization insulating layer 141 and the first upper organic layer 141a are formed after forming the inorganic protective layer PVX. In such an embodiment, the first planarization insulating layer 141 and the first upper organic layer 141a are spaced apart from each other. Accordingly, a portion of the inorganic protective layer PVX is not covered by the first planarization insulating layer 141 and the first upper organic layer 141a.

Then, to form wirings such as the driving voltage line PL and/or the second connection metal CM2 on the inorganic protective layer PVX, a conductive layer is formed on the entire surface of the substrate 100 and then patterned by etching, thereby forming the driving voltage line PL and/or the second connection metal CM2.

In such an embodiment, during such a process, the interfacial properties of the portion of the inorganic protective layer PVX not covered by the first planarization insulating layer 141 or the first upper organic layer 141a are changed in the process of forming and etching the conductive layer, and thus, the adhesion between the inorganic protective layer PVX and the second upper organic layer 142a may be improved. The third upper organic layer 150a and the pixel defining layer 150 are formed by using a same material during a same process. Accordingly, due to variations that may occur in the process of forming the pixel electrode 310 prior to the formation of the third upper organic layer 150a, the adhesion between the third upper organic layer 150a and the inorganic protective layer PVX may be weaker than that between the second upper organic layer 142a and the inorganic protective layer PVX. Accordingly, in an embodiment, the adhesion between the upper organic layer 260 and the inorganic protective layer PVX may be improved by positioning the second upper organic layer 142a as the outermost portion of the side of the upper organic layer 260 adjacent to the display area.

The intensity of the adhesion identified above was identified by performing experiments in which: the first upper organic layer 141a is formed immediately on the first upper organic layer 141a and then exfoliated therefrom; a conductive layer is formed on the inorganic protective layer PVX and then etched and then the second upper organic layer 142a is formed thereon and exfoliated therefrom; and a conductive layer is formed on the inorganic protective layer PVX and then etched and then the third upper organic layer 150a is formed thereon and exfoliated therefrom.

Hereinafter, other configurations in the non-display area NDA will be described in detail.

The buffer layer 110, the gate insulating layer 120 and the interlayer insulating layer 130 are located on the substrate 100, and are collectively referred to as an inorganic insulating layer IL. In an embodiment, an opening OP corresponding to the bending area BA is defined in the inorganic insulating layer IL. The term "corresponding" used herein may be understood as overlapping. In such an embodiment, openings 110a, 120a, and 130a corresponding to the bending area BA may be defined in the buffer layer 110, the gate insulating layer 120 and the interlayer insulating layer 130, respectively. The opening 130a of the interlayer insulating layer 130 may include openings 131a and 132a of the first and second interlayer insulating layers 131 and 132. In an embodiment as shown in FIG. 3, the opening OP passes through the inorganic insulating layer IL, but the disclosure is not limited thereto. In an alternative embodiment, the inorganic insulating layer IL may have a recess (or groove) corresponding to the bending area BA. The recess may mean that a portion of the inorganic insulating layer IL is removed in a depth direction thereof and a portion of the inorganic insulating layer IL remains. In one embodiment, for example, the openings 120a and 130a corresponding to the bending area BA are defined through the gate insulating layer 120 and the interlayer insulating layer 130, and no opening is defined in the buffer layer 110, such that the buffer layer 110 may continuously extend in the first area 1A, the bending area BA and the second area 2A.

The area of the opening OP may be wider than the area of the bending area BA. In this regard, a width OW of the opening OP illustrated in FIG. 3 is greater than the width of the bending area BA. The area of the opening OP may be defined as the narrowest area among the areas of the openings 110a, 120a and 130a of the buffer layer 110, the gate insulating layer 120 and the interlayer insulating layer 130. In an embodiment, as shown in FIG. 3, the area of the opening OP of the inorganic insulating layer IL may be defined as the area of the opening 110a of the buffer layer 110 of the insulating layer IL. In an embodiment, as shown in FIG. 3, the inner surface of the opening 110a of the buffer layer 110 is flush with the inner surface of the opening 120a of the gate insulating layer 120, but the disclosure is not limited thereto. In one embodiment, for example, the area of the opening 120a of the gate insulating layer 120 may be wider than the area of the opening 110a of the buffer layer 110. In one embodiment, the area of the opening 130a of the interlayer insulating layer 130 may be wider than the area of the opening 120a of the gate insulating layer 120.

The organic layer 160 may fill the opening OP of the inorganic insulating layer IL. The organic layer 160 and the bending area BA may overlap, and at least a portion of the organic layer 160 may be located within the opening OP of the inorganic insulating layer IL. The organic layer 160 may extend, to a non-bending area around the bending area BA, onto a portion of first and second areas 1A and 2A adjacent to, for example, the bending area BA.

The organic layer 160 may include at least one material selected from acrylic, methacrylic, polyester, polyethylene, polypropylene, polyethylene terephthalate, PEN, PC, PI, polyethylene sulfonate, polyoxymethylene, polyarylate, and HMDSO.

The inner wiring 210 is located in the first area 1A of the non-display area NDA, and the outer wiring 220 is located on the second area 2A of the non-display area NDA.

The inner wiring 210 may be electrically connected to pixels in the display area DA. In an embodiment, the inner wiring 210 may be electrically connected to the first and second TFTs T1 and T2 and/or wirings such as the data line DL, and a pixel circuit may be electrically connected to a display device or element. A portion of the inner wiring 210 may extend toward the display area DA, or may be electrically connected to a conductive layer/a wiring (not shown) outside the display area DA.

The outer wiring 220 may be, in the non-display area NDA, connected to a wiring (not shown) located on a layer on which the outer wiring 220 is not located and/or to a terminal unit (see 20 of FIG. 1) of the non-display area NDA. In an embodiment, an end of the outer wiring 220 may be exposed to the outside and connected to an electronic device or the flexible film 60 described above with reference to FIG. 1.

The inner wiring 210 and the outer wiring 220, which are spaced apart from each other with the bending area BA therebetween, may each be connected to the connection wiring 230. In an embodiment, as shown in FIG. 3, the connection wiring 230 extends across the bending area BA to form a bridge wiring electrically connected to the inner and outer wirings 210 and 220. The connection wiring 230, which is the bridge wiring, may be located on the bending area BA and the first and second areas 1A and 2A adjacent to the bending area BA.

The connection wiring 230 is located on a layer on which the inner wiring 210 and the outer wiring 220 are not located, with the interlayer insulating layer 130 therebetween. Regarding the connection wiring 230, a portion of the connection wiring 230 corresponding to the bending area BA is located on the organic layer 160, and a portion of the connection wiring 230 corresponding to the first and second area 1A and 2A may be located inside an organic through-hole 160h of the organic layer 160.

The organic through-hole 160h may overlap and expose a first contact hole CNT1 of the interlayer insulating layer 130. Facing ends of the connection wiring 230 are arranged to correspond to the organic through-hole 160h in the first and second areas 1A and 2A, and may be connected to the inner and outer wirings 210 and 220 through the first contact hole CNT1. FIG. 3 illustrates an embodiment in which two first contact holes are located in one organic through-hole, and the disclosure is not limited thereto. The number of first contact holes provided in an organic through-hole may be variously modified.

Although FIG. 3 shows the display apparatus in an unbent state for convenience of illustration and description, the display apparatus, for example, the substrate 100 of the display apparatus, may be bent at the bending area BA as shown in FIG. 2. In one embodiment, for example, the display apparatus is manufactured in a state where the substrate 100 is roughly flat as shown in FIG. 3, and then the substrate 100 and the like are bent at the bending area BA to have the shape as shown in FIG. 2. In the process of bending the substrate 100 at the bending area BA thereof, tensile stress may be applied to components located in the bending area BA.

Accordingly, in such an embodiment, the opening OP may be formed in an area corresponding to the bending area BA of the inorganic insulating layer IL to effectively prevent cracking of the inorganic insulating layer IL due to tensile stress. In an embodiment, where the connection wiring 230 extends across the bending area BA as shown in FIG. 3, the connection wiring 230 may crack or may be disconnected in the being process. Accordingly, in an embodiment, the connection wiring 230 may include a material having a relatively high elongation to prevent the cracking or disconnection. In such an embodiment, the inner and outer wirings 210 and 220 on the first and second areas 1A and 2A may be formed by using materials having electrical/physical characteristics which are different from those of the connection wiring 230, such that the efficiency of electrical signal transmission in the display apparatus may be improved and the incidence of defects in the manufacturing process may be reduced.

In one embodiment, for example, the inner wiring 210 and the outer wiring 220 may each include molybdenum, and the connection wiring 230 may include aluminum. The inner wiring 210, the outer wiring 220, and the connection wiring 230 may each be a single film or a multilayer film. The connection wiring 230 may have a three-layer structure of Ti/Al/Ti, and the thickness of Ti may be 0.15 times or less than the thickness of Al, for example, 0.12 times or less.

Referring to FIG. 3, the inner and outer wirings 210 and 220 are formed in the process of forming the first and second gate electrodes G1 and G2 and include a same material as used to form the first and second gate electrodes G1 and G2. The connection wiring 230 may be formed in the process of forming the data line DL and may include a same material as used to form the data line DL.

In the non-display area NDA, the inorganic protective layer PVX covers wirings located in a same layer in which the driving voltage supply line 30 is located, and may be disposed on the inorganic insulating layer IL. A portion of the inorganic protective layer PVX corresponding to the bending area BA may be removed by, for example, an etching process. When the inorganic protective layer PVX remains unremoved from the bending area BA, the inorganic protective layer PVX may crack when the substrate 100 is bent around the bending area BA, or the crack propagates through the inorganic protective layer PVX, leading to damages on other layers.

The inorganic protective layer PVX may be located in an area other than the bending area BA. In such an embodiment, the inorganic protective layer PVX may be located on a portion of a top surface of the organic layer 160. In such an embodiment, the inorganic protective layer PVX may cover at least a portion of the connection wiring 230 in the first and second areas 1A and 2A.

In an embodiment, as described above, the upper organic layer 260 in direct contact with the inorganic protective layer PVX may be located on the inorganic protective layer PVX. The upper organic layer 260 contacts the inorganic protective layer PVX and overlaps the bending area BA. A bending protection layer ("BPL") 600 may be located on the upper organic layer 260. The upper organic layer 260 and the BPL 600 may correspond to at least the bending area BA and may be positioned on the connection wiring 230.

When any stacked structure is bent, a stress neutral plane exists in the stacked structure. In an embodiment, if the BPL 600 is not included, excessive tensile stress or the like may be applied to the connection wiring 230 in the bending area BA due to the bending of the substrate 100 or the like as described later because the location of the connection wiring 230 may not correspond to the stress neutral plane. In an embodiment, the position of the stress neutral plane in the stacked structure including the substrate 100, the connection wiring 230, the upper organic layer 260 and the BPL 600 may be appropriately adjusted by including the BPL 600 and controlling the thickness and modulus thereof.

Thus, by placing the stress neutral plane near the connection wiring 230 by using the BPL 600, the tensile stress applied to the connection wiring 230 may be minimized, and thus, the bending area BA is protected. The BPL 600 may be formed by applying and curing a liquid or paste material.

Figure 4:
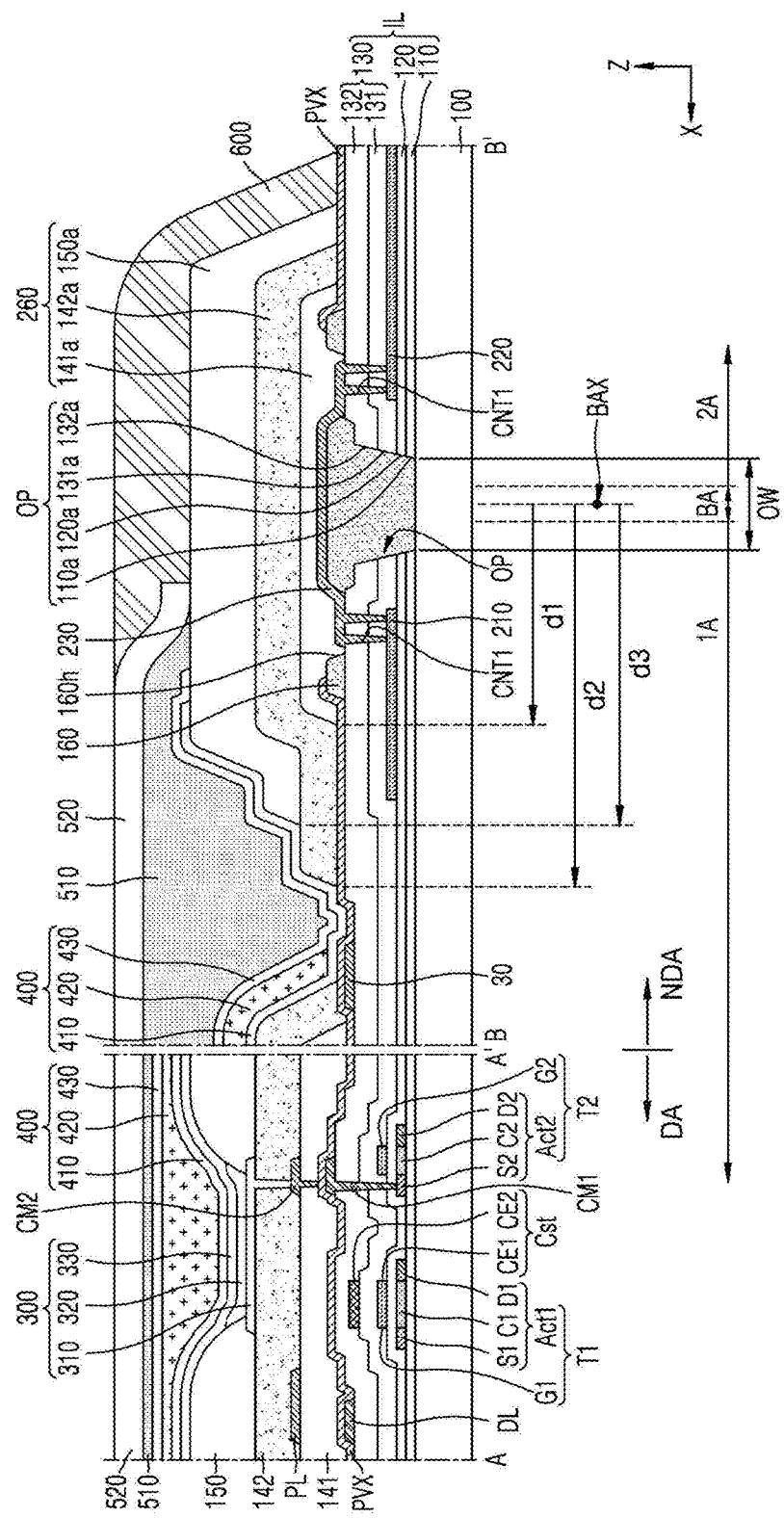
FIG. 4 shows a cross-sectional view of a display apparatus according to an alternative embodiment of the disclosure.
Figure 5:
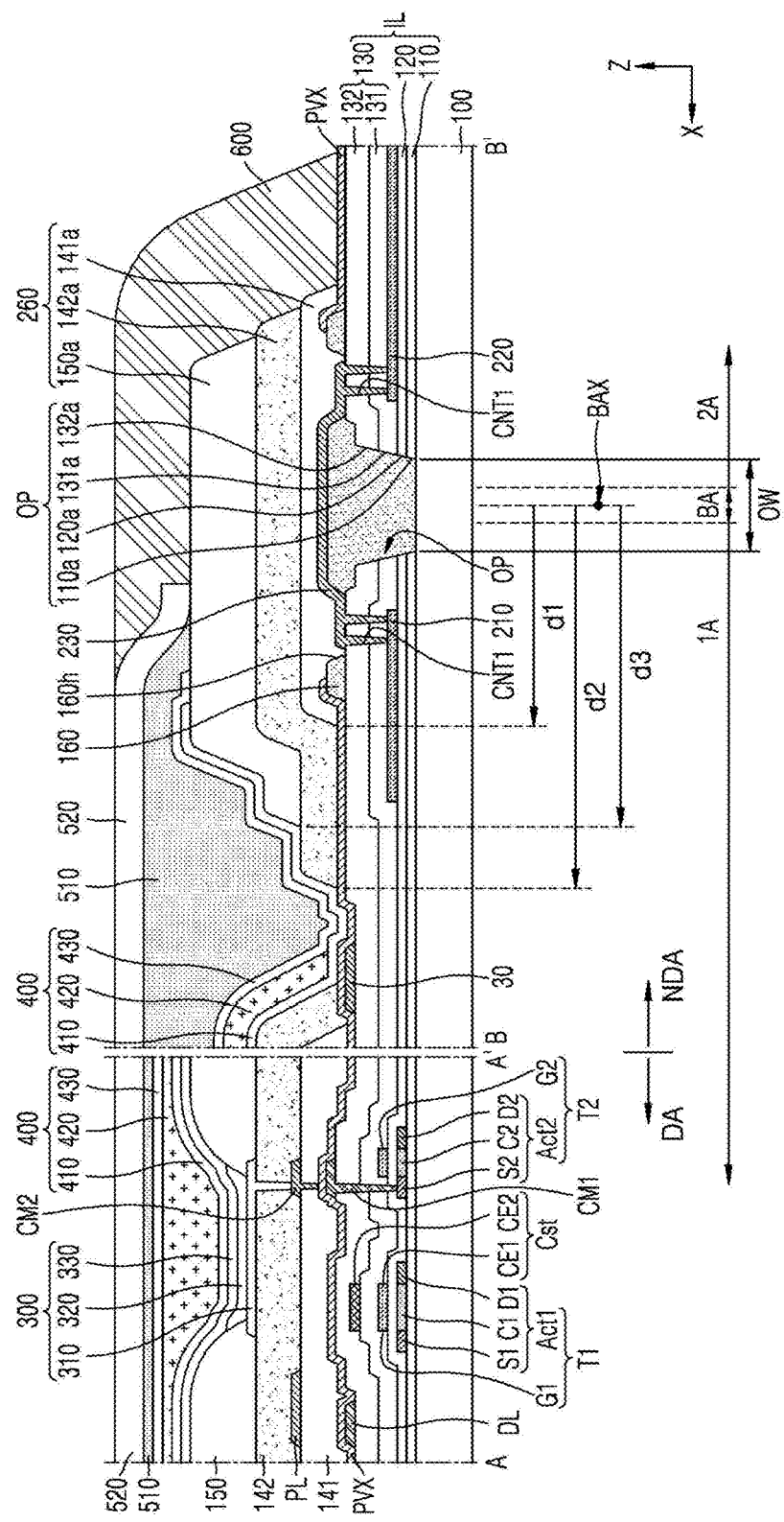
FIG. 5 shows a cross-sectional view of a display apparatus according to another alternative embodiment of the disclosure.

FIGS. 4 and 5 are each a schematic cross-sectional view of a portion of a display apparatus according to an alternative embodiment of the disclosure. The cross-sectional views in FIGS. 4 and 5 are substantially the same as the cross-sectional view shown in FIG. 3 except for the upper organic layer 260. The same or like elements shown in FIGS. 4 and 5 have been labeled with the same reference characters as used above to describe the embodiments of the display apparatus shown in FIG. 3, and any repetitive detailed description thereof will hereinafter be omitted or simplified.

In an embodiment of the display apparatus, the end of the top film 520 is located on the upper organic layer 260, and the top film 520 is attached on the encapsulation layer 400 in such a manner that the top film 520 is pressed from an end thereof in the non-display area NDA toward the display area DA. Accordingly, the adhesion between the upper organic layer 260 and the inorganic protective layer PVX at the side of the upper organic layer 260 adjacent to the display area DA may be stronger than other sides thereof. In such an embodiment, the upper organic layer 260 may be asymmetrically with respect to the bending area BA.

In an embodiment, as shown in FIG. 4, in the side of the upper organic layer 260 adjacent to the display area DA, the second upper organic layer 142a is in direct contact with the inorganic protective layer PVX, and the third upper organic layer 150a exposes the end of the second upper organic layer 142a.

In such an embodiment, in the other side of the upper organic layer 260 which is not adjacent to the display area DA, the third upper organic layer 150a covers the end of the second upper organic layer 142a without exposing the second upper organic layer 142a.

The other side of the upper organic layer 260 which is not adjacent to the display area DA is an area that does not receive the pressure applied when the top film 520 is attached. Accordingly, in such an embodiment, the influence of residues remaining on the second upper organic layer 142a may be minimized rather than strengthening adhesion between the upper organic layer 260 and the inorganic protection layer PVX.

In an embodiment, a conductive layer for forming the pixel electrode 310 may be provided on the entire upper surface of the second upper organic layer 142a, and then, patterned by an etching process to form the pixel electrode 310. During such processes, residues may remain on the second upper organic layer 142a, and such residues may result in defects in a subsequent process. Thus, in an embodiment, the third upper organic layer 150a may cover the other end of the second upper organic layer 142a opposite to an end of the second upper organic layer 142a adjacent to the display area DA to prevent such residue from causing defects in a subsequent process.

In an alternative embodiment, as shown in FIG. 5, in the side of the upper organic layer 260 adjacent to the display area DA, the second upper organic layer 142a is in direct contact with the inorganic protective layer PVX, and the third upper organic layer 150*a* exposes the end of the second upper organic layer 142*a*.

In such an embodiment, in the other side of the upper organic layer 260 which is not adjacent to the display area DA, the second upper organic layer 142*a* is not in direct contact with the inorganic protective layer PVX. The first upper organic layer 141*a*, the second upper organic layer 142*a* and the third upper organic layer 150*a* may constitute a stair shape having steps with respect to each other. Such a structure allows the end of the upper organic layer 260 to have a gentle slope.

In such embodiments, in the other side of the upper organic layer 260 which is not adjacent to the display area DA, a portion of the inorganic protective layer PVX is disposed under the upper organic layer 260. However, the disclosure is not limited thereto. In one alternative embodiment, for example, in the other side of the upper organic layer 260 which is not adjacent to the display area DA, no portion of the inorganic protective layer PVX is disposed under the upper organic layer 260.

Figure 6:
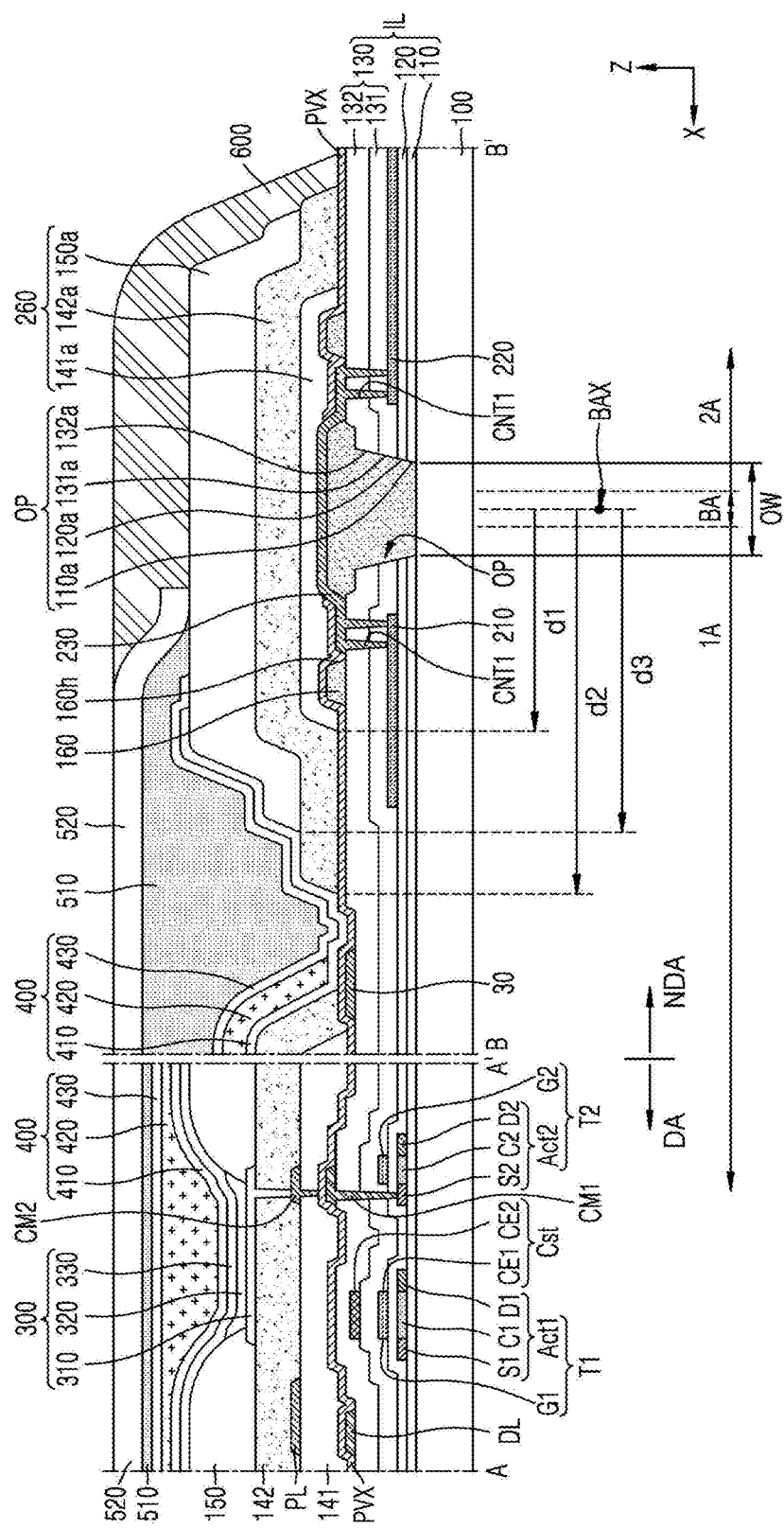
FIG. 6 shows a cross-sectional view of a display apparatus according to another alternative embodiment of the disclosure.

FIG. 6 shows a cross-sectional view of a portion of a display apparatus according to another alternative embodiment of the disclosure. The cross-sectional view in FIG. 6 is substantially the same as the cross-sectional view shown in FIG. 3 except for the inorganic protective layer PVX. The same or like elements shown in FIG. 6 have been labeled with the same reference characters as used above to describe the embodiments of the display apparatus shown in FIG. 3, and any repetitive detailed description thereof will hereinafter be omitted or simplified.

In an embodiment, as shown in FIG. 6, the inorganic protective layer PVX may cover a portion of the connection wiring 230 corresponding to the first contact hole CNT1 in the non-display area NDA.

In such an embodiment, the inner and outer wirings 210 and 220 may contact the connection wiring 230 through the first contact hole CNT1 and at least a portion of the upper surface of the connection wiring 230 may be covered by the inorganic protective layer PVX as described above.

The inorganic protective layer PVX may cover the portion of the connection wiring 230 corresponding to the first contact hole CNT1 in the first area 1A. The inorganic protective layer PVX may be disposed to correspond to a contact portion where the inner wiring 210 contacts the connection wiring 230, a portion of the upper surface of the interlayer insulating layer 130 adjacent thereto, and a portion of the organic layer 160. In such an embodiment, the inorganic protective layer PVX is located on the connection wiring 230 in such a way that the inorganic protective layer PVX covers, in addition to a portion thereof corresponding to the first contact hole CNT1, other portions.

In such an embodiment, the inorganic protective layer PVX may cover a portion of the connection wiring 230 corresponding to the first contact hole CNT1 in the second area 2A. The inorganic protective layer PVX may be disposed to correspond to a contact portion where the outer wiring 220 contacts the connection wiring 230, a portion of the upper surface of the interlayer insulating layer 130 adjacent thereto, and a portion of the organic layer 160. The inorganic protective layer PVX is located on the connection wiring 230 in such a way that the inorganic protective layer PVX covers, in addition to a portion thereof corresponding to the first contact hole CNT1, other portions.

When the inorganic protective layer PVX is removed during a manufacturing process thereof without covering at least a portion of the connection wiring 230, for example, in an etching process, in which the inorganic protective layer PVX on the bending area BA and the first and second areas 1A and 2A in the non-display area NDA is completely removed, an upper portion of the connection wiring 230 may be damaged and/or may finely crack in a subsequent process. The damage and/or fine cracks may occur in the relatively fragile steps adjacent to the first contact hole CNT1. Moisture may permeate through the damage and/or fine cracks so that a metal oxide (e.g., AlOx) is generated around the steps adjacent to the first contact hole CNT1, the resistance of the connection wiring 230 is reduced, and the inner and outer wirings 210 and 220 are disconnected around the metal oxide. Accordingly, in an embodiment, the inorganic protective layer PVX covers at least the portion of the connection wiring 230 corresponding to the first contact hole CNT1, the occurrence of the damage and/or fine cracks and the resultant moisture permeation may be effectively prevented.

Figure 7:
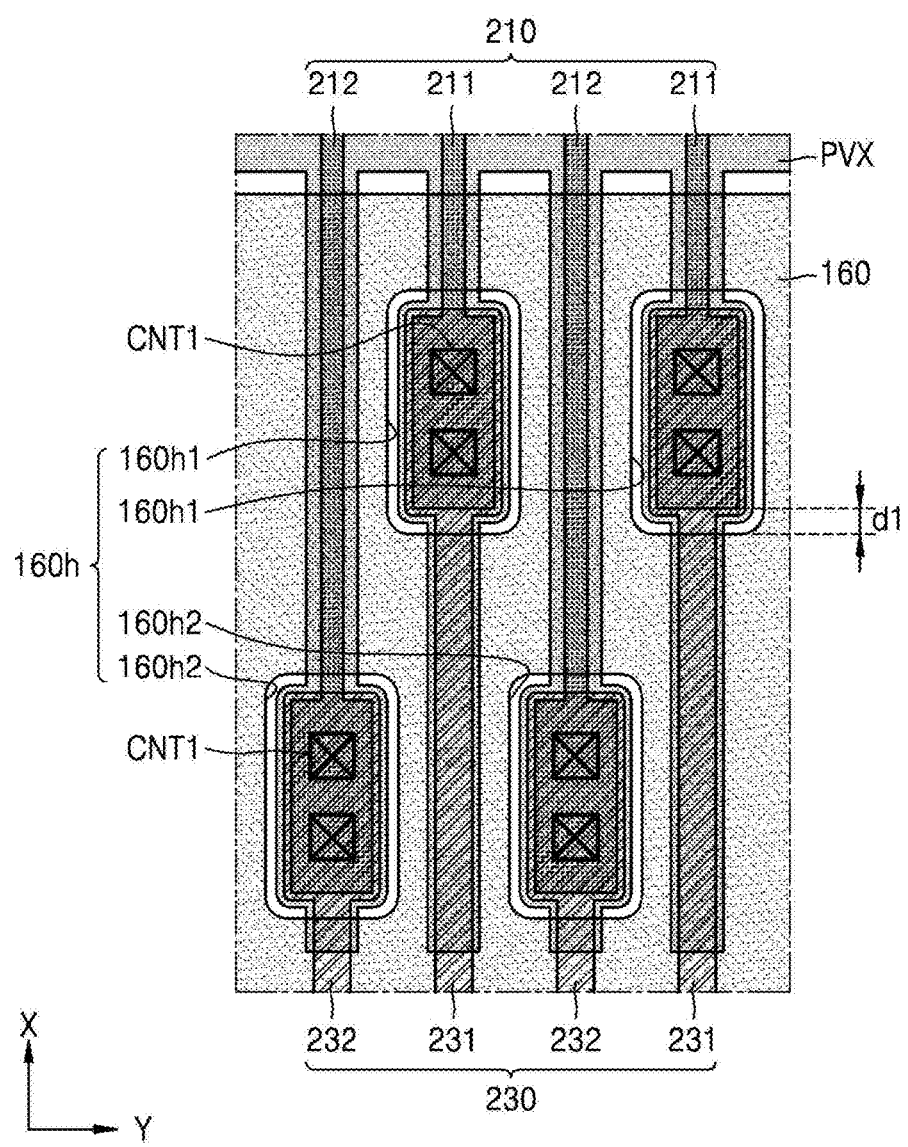
FIG. 7 shows a schematic perspective view of a wiring unit of a display apparatus according to an embodiment of the disclosure.

FIG. 7 is a plan view of a portion of a wiring unit (more particularly, a contact area of the connection wiring 230) of a display apparatus according to an embodiment of the disclosure.

Referring to FIG. 7, the inner wirings 210 may extend along the X direction and may be spaced apart from each other along the Y direction. Hereinafter, for convenience of description, some of the inner wirings 210 will be referred to as a first inner wiring 211 and the remainder will be referred to as a second inner wiring 212. Herein, a connection wiring contacting the first inner wiring 211, from among the connection wirings 230, will be referred to as a first connection wiring 231 and a connection wiring contacting the second inner wiring 212 will be referred to as a second connection wiring 232. In such an embodiment, the organic through-hole 160*h* defined through the organic layer 160 includes a first organic through-hole 160*h*1 and a second organic through-hole 160*h*2, where the first organic through-hole 160*h*1 is a through-hole corresponding to the contact between the first inner wiring 211 and the first connection wiring 231, and the second organic through-hole 160*h*2 is a through-hole corresponding to the contact between the second inner wiring 212 and the second connection wiring 232. The first and second connection wirings 231 and 232 illustrated in FIG. 7 may be bridge wirings extending across the bending area BA and electrically connecting the inner wiring 210 with the outer wiring 220, as described above with reference to FIG. 3.

The contact area between the first inner wiring 211 and the first connection wiring 231 and the contact area between the second inner wiring 212 and the second connection wiring 232 may be arranged alternately with each other or staggered from each other. The contact area between the first inner wiring 211 and the first connection wiring 231 and the contact area between the second inner wiring 212 and the second connection wiring 232 may be staggered in a zigzag manner, and accordingly, the distance between the first inner wiring 211 and the second inner wirings 212 may be narrowed and thus, spatial efficiency may be improved.

The organic layer 160 overlaps the first and second inner wirings 211 and 212 and the first and second connection wirings 231 and 232, and the first and second organic through-holes 160*h*1 and 160*h*2 for contacting between the first inner wiring 211 and the first connection wiring 231 and between the second inner wiring 212 and the second connection wiring 232 are defined through the organic layer 160. The first organic through-hole 160*h*1 corresponds to the overlapping portion of the first inner wiring 211 and the first connection wiring 231, the second organic through-hole 160*h*2 corresponds to the overlapping portion of the second inner wiring 212 and the second connection wiring 232, and the first organic through-hole 160*h*1 and the second organic through-hole 160*h*2 may be arranged in a zigzag manner.

The inorganic protective layer PVX corresponds to the first and second organic through-holes 160*h*1 and 160*h*2 and may cover the contact area between the first inner wirings 211 and the first connection wirings 231 and the contact area between the second inner wirings 212 and the second connection wirings 232. In one or more embodiments, the inorganic protective layer PVX may overlap a portion of the organic layer 160. In one embodiment, for example, the inorganic protective layer PVX may overlap at least a portion of the first and second inner wires 211 and 212 and the first and second connection wires 231 and 232.

An interlayer insulating layer (see 130 of FIG. 6), in which the first contact hole CNT1 is defined, is located on the first inner wiring 211. The organic layer 160 may be located on the interlayer insulating layer 130, and the first organic through-hole 160*h*1 formed through the organic layer 160 by removing a portion of the organic layer 160 corresponding to the first contact hole CNT1. A portion of the first connection wiring 231 corresponding to the first organic through-hole 160*h*1 may be connected to the first inner wiring 211 through the first contact hole CNT1.

I, such an embodiment, the interlayer insulating layer 130, in which the first contact hole CNT1 is defined, is located on the second inner wiring 212, and the organic layer 160 is located on the interlayer insulating layer 130. In an embodiment, the second organic through-hole 160*h*2 is formed through the organic layer 160 by removing a portion of the organic layer 160 corresponding to the first contact hole CNT1. The portion of the second connection wiring 232 corresponding to the second organic through-hole 160*h*2 may be connected to the second inner wiring 212 through the first contact hole CNT1.

The first organic through-hole 160*h*1 may be spaced apart from an end of the first inner wiring 211 by a predetermined distance. In one embodiment, for example, a distance d1 between a lower end of the first organic through-hole 160*h*1 and the end of the first inner wiring 211 may be in a range from about 4 micrometers (μm) to about 8 μm. In such an embodiment, a lower end of the second organic through-hole 160*h*2 may be spaced apart from an end of the second inner wiring 212 by the predetermined distance described above.

The inorganic protective layer PVX may cover a portion of the first connection wiring 231 corresponding to the first contact hole CNT1 and a portion of the second connection wiring 232 corresponding to the first contact hole CNT1, and accordingly, the damage and/or fine cracks on the first and second connecting wirings 231 and 232 and the resultant moisture permeation may be effectively prevented.

In an embodiment, the inorganic protective layer PVX may be patterned in such a way that at least a portion thereof conforms to the shape of the connection wiring 230, and the width of the inorganic protective layer PVX is greater than the width of the connection wiring 230. In such an embodiment, opposing edges of a portion of the inorganic protective layer PVX in the Y direction on the organic layer 160 may contact the top surface of the organic layer 160.

In such an embodiment, where the inorganic protective layer PVX is patterned as described above, the inorganic protective layer PVX may expose a portion of the top surface of the organic layer 160. A portion of the top surface of the organic layer 160 which is not covered by the inorganic protective layer may function as an out-gassing path through which a material included in the organic layer 160 is vaporized and discharged toward the outside in a curing process of the organic layer 160 in the manufacturing process of the display apparatus.

The structure in which the inner wiring 210 is connected to the connection wiring 230 in an embodiment has been described with reference to FIG. 7. However, such a structure is also applicable to the connection structure between the outer wiring 220 and the connection wiring 230 described with reference to FIGS. 3 to 6.

Figure 8:
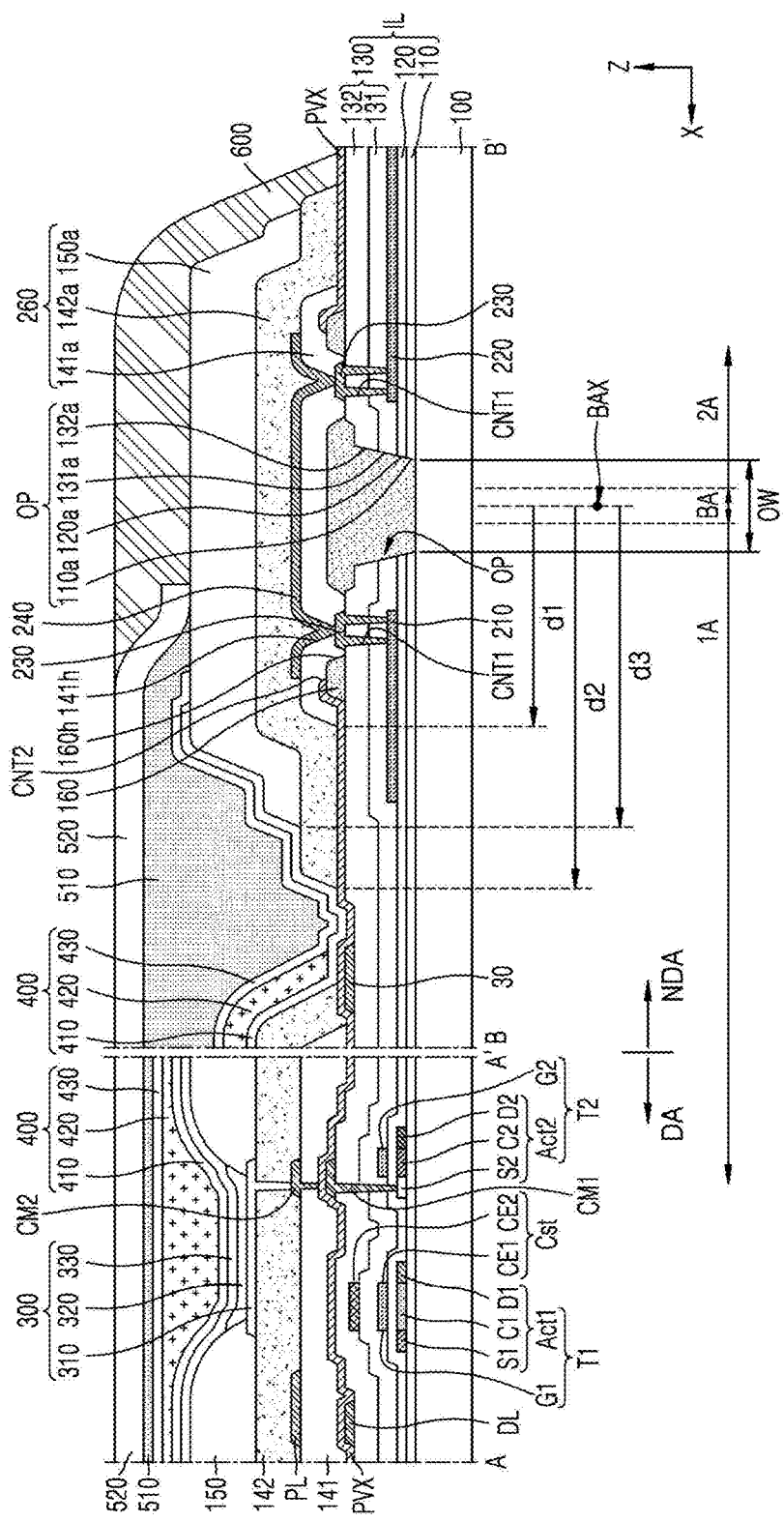
FIG. 8 shows a cross-sectional view of a display apparatus according to an embodiment of the disclosure.

FIG. 8 is a cross-sectional view schematically showing a portion of a display apparatus according to another alternative embodiment of the disclosure. The cross-sectional view in FIG. 8 is substantially the same as the cross-sectional view shown in FIG. 3 except for the upper organic layer 260, the connection wiring 230 and an additional connection wiring 240. The same or like elements shown in FIG. 8 have been labeled with the same reference characters as used above to describe the embodiments of the display apparatus shown in FIG. 3, and any repetitive detailed description thereof will hereinafter be omitted or simplified.

In an alternative embodiment, as shown in FIG. 8, in the side of the upper organic layer 260 adjacent to the display area DA, the second upper organic layer 142*a* is in direct contact with the inorganic protective layer PVX, and the third upper organic layer 150*a* exposes the end of the second upper organic layer 142*a*. In such an embodiment, the first upper organic layer 141*a* covers the bending area BA, such that the adhesion between the upper organic layer 260 and the inorganic protective layer PVX may be improved.

In some embodiments, as described above, the connection wiring 230 may extend across the bending area BA and may be located under the first upper organic layer 141*a* in the bending area BA. In an alternative embodiment, as shown in FIG. 8, the connection wiring 230 is located only in the first area 1A and the second area 2A, and an additional connection wiring 240 is provided on the first upper organic layer 141*a* across the bending area BA.

Referring to FIG. 8, the connection wiring 230 is the form of an island and may be located in first and second areas 1A and 2A. In an embodiment, as described with reference to FIG. 3, the connection wiring 230 is a bridge wiring across the bending area BA. In an alternative embodiment, as shown in FIG. 8, the connection wiring 230 may correspond to an island electrode layer. In such an embodiment, the connection wiring 230 may be located corresponding to the organic through-hole 160*h*.

The organic through-hole 160*h* may overlap and expose the first contact hole CNT1 of the interlayer insulating layer 130. The connection wiring 230 corresponds to the organic through-hole 160*h* of each of the first and second areas 1A and 2A, and may be connected to each of the inner and outer wiring 210 and 220 through the first contact hole CNT1.

The additional connection wiring 240 may electrically connect the inner wiring 210 of the first area 1A with the outer wiring 220 of the second area 2A. The additional connection wiring 240 may extend across the bending area BA and may be a bridge wiring that electrically connects the inner wiring 210 with the outer wiring 220.

The additional connection wiring 240 may include a material having electrical/physical characteristics which are different from those of a material that constitutes the inner and outer wirings 210 and 220. In one embodiment, for example, the inner and outer wirings 210 and 220 may each include molybdenum, and the additional connection wiring 240 may include aluminum. The additional connection wiring 240 may be a single film or a multilayer film. In one embodiment, for example, the additional connection wiring 240 may be a three-layer structure of Ti/Al/Ti, and the thickness of Ti may be 0.15 times or less than the thickness of Al, for example, 0.12 times or less. However, the disclosure is not limited thereto The first upper organic layer 141a is located under the additional connection wiring 240. The first upper organic layer 141a may have an upper organic through-hole 141h overlapping a second contact hole CNT2 of the inorganic protective layer PVX. In an embodiment, as shown in FIG. 8, the upper organic through-hole 141h of the first upper organic layer 141a is located inside the organic through-hole 160h of the organic layer 160. However, the disclosure is not limited. In one embodiment, for example, a plurality of upper organic through-holes may be located in a single organic through-hole.

Figure 9:
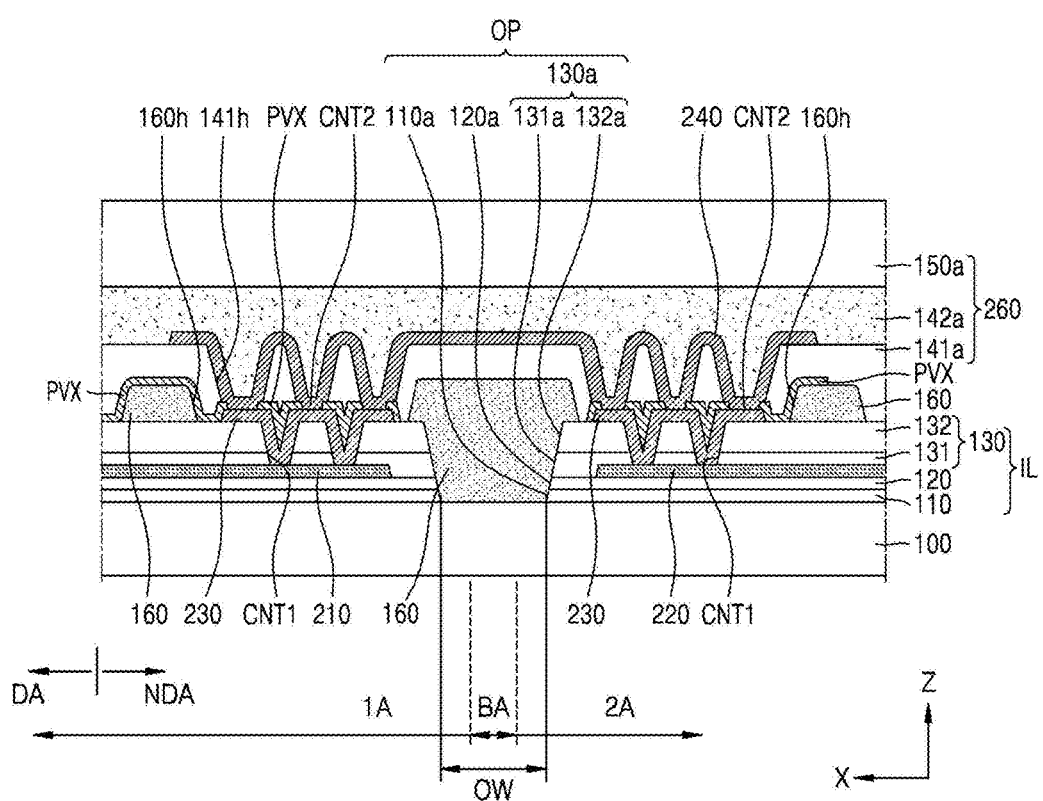
FIG. 9 shows a cross-sectional view of a non-display area of a display apparatus according to an embodiment of the disclosure.

FIG. 9 shows a schematic cross-sectional view of a portion of a display apparatus according to another alternative embodiment of the disclosure. More particularly, FIG. 9 shows an area where the additional connection wiring 240 is located. The cross-sectional view in FIG. 9 is substantially the same as the cross-sectional view shown in FIG. 8 except for the upper organic layer 260, the connection wiring 230 and the additional connection wiring 240. The same or like elements shown in FIG. 9 have been labeled with the same reference characters as used above to describe the embodiments of the display apparatus shown in FIG. 8, and any repetitive detailed description thereof will hereinafter be omitted or simplified.

Referring to FIG. 9, in an embodiment, a plurality of upper organic through-holes 141h is defined in a portion of the first upper organic layer 141a in the organic through-hole 160h, and the additional connection wiring 240 may be connected to the connection wiring 230 having the island shape through the upper organic through-holes 141h and the second contact holes CNT2.

The additional connection wiring 240 may electrically connect the inner wiring 210 in the first area 1A with the outer wiring 220 in the second area 2A. The additional connection wiring 240 may extend across the bending area BA and may be a bridge wiring that electrically connects the inner wiring 210 with the outer wiring 220.

The additional connection wiring 240 may be formed by using a same material as that of the driving voltage line PL on a first planarization layer in the display area DA, and the additional connection wiring 240 and the driving voltage line PL may be formed during a same process.

The inorganic protective layer PVX may cover the portion of the connection wiring 230 corresponding to the first contact hole CNT1. The inorganic protective layer PVX may correspond to a contact portion between the inner wiring 210 and a conductive layer, the inner wall of the interlayer insulating layer 130 surrounding the first contact hole CNT1, and a portion of the upper surface of the interlayer insulating layer 130 which is connected to the inner wall. The width of a portion of the inorganic protective layer PVX overlapping the first contact hole CNT1 may be greater than the width of a portion of the inorganic protective layer PVX above the first contact hole CNT1. In such an embodiment, as described above, the inorganic protective layer PVX covers the steps around the first contact hole CNT1, such that the generation of a metal oxide (for example, AlOx) and a decrease in the resistance of the connection wiring 230 around the steps due to the occurrence of the damage and/or fine cracks on the connection wiring 230 and the permeation of moisture in the steps may be effectively prevented.

The additional connection wiring 240 may be connected to the connection wiring 230 through the second contact hole CNT2 defined through the inorganic protective layer PVX. The inner and outer wirings 210 and 220 each contact the connection wiring 230 through the first contact hole CNT1 in the interlayer insulating layer 130, and the additional connection wiring 240 contacts the connection wiring 230 through the second contact hole CNT2 in the inorganic protective layer PVX. Due to such contacts, the inner wiring 210 may be electrically connected to the outer wiring 220.

In such an embodiment, since the inorganic protective layer PVX covers a portion of the connection wiring 230 corresponding to the first contact hole CNT1 to prevent damage and/or fine cracks as described above, the second contact hole CNT2 for contacting the conductive layer and the additional connection wiring 240 may be spaced apart from the first contact hole CNT1 by a predetermined interval not to overlap the first contact hole CNT1.

Figure 10:
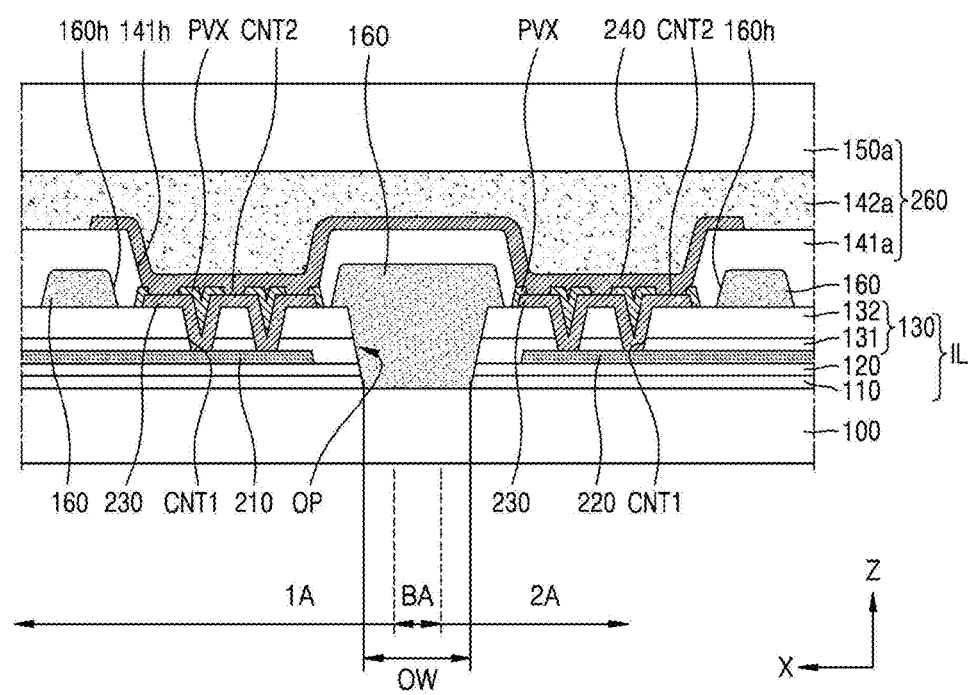
FIG. 10 shows a cross-sectional view of a non-display area of a display apparatus according to an alternative embodiment of the disclosure.

FIG. 10 shows a cross-sectional view of a portion of a display apparatus according to another alternative embodiment of the disclosure. The cross-sectional view in FIG. 10 is substantially the same as the cross-sectional view shown in FIG. 8 except for the upper organic layer 260, the connection wiring 230 and the additional connection wiring 240. The same or like elements shown in FIG. 10 have been labeled with the same reference characters as used above to describe the embodiments of the display apparatus shown in FIG. 8, and any repetitive detailed description thereof will hereinafter be omitted or simplified.

Referring to FIG. 10, in an embodiment, only one upper organic through-hole is defined through the first upper organic layer 141a in the second area 2A, and the inorganic protective layer PVX may be located in the contact area of the connection wiring 230. In one embodiment, for example, the upper organic through-hole 141h in the first upper organic layer 141a corresponds to the organic through-hole 160h of the organic layer 160, and exposes the second contact hole CNT2 defined in the inorganic protective layer PVX. In such an embodiment, the upper organic through-hole 141h in the first upper organic layer 141a may be smaller than the organic through-hole 160h to improve the step coverage of the additional connection wiring 240 on the first upper organic layer 141a.

Figure 11:
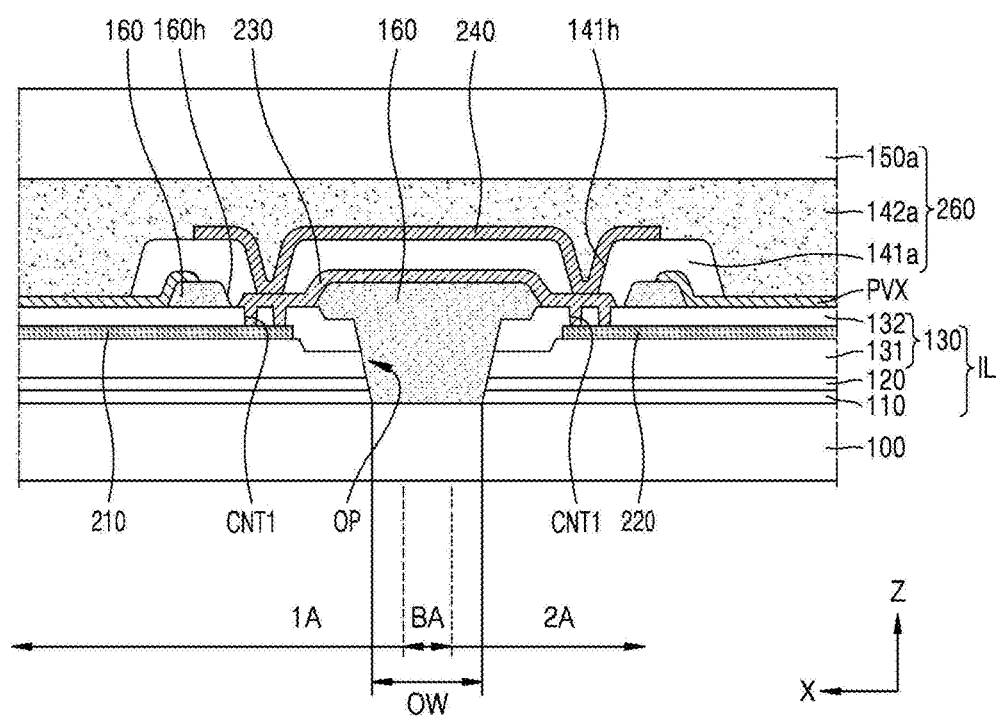
FIG. 11 shows a cross-sectional view of a non-display area of a display apparatus according to another alternative embodiment of the disclosure.

FIG. 11 shows a cross-sectional view of a portion of a display apparatus according to another alternative embodiment of the disclosure. The cross-sectional view in FIG. 11 is substantially the same as the cross-sectional view shown in FIG. 8 except for the connection wiring 230 and the additional connection wiring 240. The same or like elements shown in FIG. 11 have been labeled with the same reference characters as used above to describe the embodiments of the display apparatus shown in FIG. 8, and any repetitive detailed description thereof will hereinafter be omitted or simplified.

Referring to FIG. 11, in an embodiment, the connection wiring 230 and the additional connection wiring 240 may all be a bridge wiring which connects the inner wiring 210 with the outer wiring 220. In such an embodiment, the connection wiring 230 and the additional connection wiring 240 may all extend across the bending area BA. In the bending area BA, the first upper organic layer 141a may be between the connection wiring 230 and the additional connection wiring 240.

The connection wiring 230 and a data line may be formed by using a same material during a same process, and the additional connection wiring 240 and a driving voltage line may be formed by using a same material during a same process. The connection wiring 230 and the additional connection wiring 240 may be connected through the upper organic through-hole 141*h*.

The connection wiring 230 and the additional connection wiring 240 may each include a conductive material having a higher elongation than the inner and outer wires 210 and 220. In one embodiment, for example, the inner and outer wiring 210 and 220 may each include molybdenum, and the connection wiring 230 and the additional connection wiring 240 may each include aluminum.

The inner and outer wirings 210 and 220 and a second storage capacitor plate of a storage capacitor may be formed by using a same material during a same process. In one embodiment, for example, the inner and outer wires 210 and 220 and the second storage capacitor plate may each include molybdenum. In such an embodiment, the inner and outer wirings 210 and 220 may contact the connection wiring 230 through the first contact hole CNT1.

In embodiments described above, the inner wiring 210 and the outer wiring 220 may be located in a same layer as each other, but the disclosure is not limited thereto. In one alternative embodiment, as shown in FIG. 3, the inner wiring 210 may be located on the gate insulating layer 120, and as shown in FIG. 11, the outer wiring 220 may be located on the first interlayer insulating layer 131. In one embodiment, as shown in FIG. 11, the inner wiring 210 may be located on the first interlayer insulating layer 131, and as shown in FIG. 3, the outer wiring 220 may be located on the gate insulating layer 120.

In an embodiment where a plurality of inner wirings 210 is provided, some of the inner wirings 210 may be located on the gate insulating layer 120 and the others of the inner wirings may be located on the first interlayer insulating layer 131. In an embodiment where a plurality of outer wirings 220 is provided, some of the outer wirings 220 may be located on the gate insulating layer 120 and the others of the outer wirings 220 may be located on the first interlayer insulating layer 131.

In an embodiment, where the connection wiring 230 is a bridge wiring connecting the inner wirings 210 with the outer wirings 220, the connection wiring 230 located under the first upper organic layer 141*a* may be used for some of the connections between the inner wiring 210 and the outer wiring 220, and the additional connection wiring 240 located on the first upper organic layer 141*a* may be used for the other connections between the inner wiring 210 and the outer wiring 220.

According to the embodiments described above with reference to FIGS. 3 to 11, the organic layer 160 is located under the connection wiring 230 and/or the additional connection wiring 240, but the disclosure is not limited. In an alternative embodiment, where the connection wiring 230 and/or the additional connection wiring 240 in the bending area BA have a flexibility high enough to withstand stress caused by bending thereof, the organic layer 160 may be omitted.

Hereinbefore, various embodiments of the disclosure have been described. These embodiments may be embodied as separate embodiments or used in combination, e.g., the embodiment of the additional connection wiring 240 described above with reference to FIG. 9 may be applied to the embodiments described above with reference to FIG. 3.

As described above, an embodiment of the display apparatus includes an inorganic protective layer. Due to the inclusion of the inorganic protective layer, damages on wirings in the display apparatus may be effectively prevented during processes, and an adhesion between an upper organic layer and the inorganic protective layer located in a non-display area may be improved.

It should be understood that embodiments described herein should be considered in a descriptive sense only and not for purposes of limitation. Descriptions of features or aspects within each embodiment should typically be considered as available for other similar features or aspects in other embodiments.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a substrate including a display area, in which a display device is disposed and an image is displayed, and a non-display area around the display area, wherein the non-display area includes a bending area bent about a bending axis;
   a connection wiring on the substrate in the non-display area;
   a first wiring on the substrate in the display area, wherein the first wiring comprises a same material as the connection wiring;
   an inorganic protective layer on the substrate covering the first wiring, wherein the inorganic protective layer comprises an inorganic insulating material; and
   an upper organic layer on the substrate covering the bending area, wherein the upper organic layer comprises a first upper organic layer, a second upper organic layer and a third upper organic layer, which are sequentially stacked one on another all above the inorganic protection layer,
   wherein the second upper organic layer in a side of the upper organic layer, which is adjacent to the display area, has a bottom surface defining the second upper organic layer which is a closest facing surface to the substrate and is in direct contact with the inorganic protective layer, and
   the third upper organic layer exposes an end of the second upper organic layer in the side of the upper organic layer adjacent to the display area.

2. The display apparatus of claim 1, wherein
   a distance from the bending axis to the end of the second upper organic layer is greater than a distance from the bending axis to an end of the first upper organic layer in the side of the upper organic layer adjacent to the display area, and is greater than a distance from the bending axis to an end of the third upper organic layer in the side of the upper organic layer adjacent to the display area.

3. The display apparatus of claim 1, wherein
   the third upper organic layer covers the second upper organic layer in another side of the upper organic layer, which is not adjacent to the display area.

4. The display apparatus of claim 1, wherein
   portions of the first upper organic layer, the second upper organic layer and the third upper organic layer in another side of the upper organic layer, which is not adjacent to the display area, are arranged in a stair shape with steps.

5. The display apparatus of claim 1, further comprising
   a top film on the substrate in the display area,
   an end of the top film is on the upper organic layer.

6. The display apparatus of claim 1, wherein the inorganic protective layer covers at least a portion of the connection wiring.

7. The display apparatus of claim 1, further comprising:
an inner wiring and an outer wiring, which are spaced apart from each other with the bending area therebetween; and
an intermediate insulating layer on the inner wiring and the outer wiring, wherein a first contact hole is defined in the intermediate insulating layer,
wherein the connection wiring is on the intermediate insulating layer and is connected to the inner wiring and the outer wiring through the first contact hole, and
the inorganic protective layer covers a portion of the connection wiring corresponding to the first contact hole.

8. The display apparatus of claim 6, further comprising:
an organic layer between the substrate and the connection wiring,
wherein the inorganic protective layer has a patterned shape corresponding to a shape of the connection wiring and exposes the organic layer.

9. The display apparatus of claim 6, further comprising:
a thin film transistor on the substrate in the display area, wherein the thin film transistor comprises a semiconductor layer, a gate electrode, a source electrode, and a drain electrode; and
a storage capacitor on the substrate overlapping the thin film transistor, wherein storage capacitor comprises a first storage capacitor plate and a second storage capacitor plate,
wherein the connection wiring and one of the source electrode and the drain electrode are in a same layer as each other, and include a same material as each other, and
the inner wiring and at least one of the first storage capacitor plate and the second storage capacitor plate are in a same layer, and include a same material as each other.

10. The display apparatus of claim 1, further comprising:
an additional connection wiring on the first upper organic layer,
wherein an upper organic through-hole is defined in the first upper organic layer has to expose the connection wiring, and
the additional connection wiring is connected to the connection wiring through the upper organic throughhole.

11. The display apparatus of claim 10, wherein
at least a portion of the inorganic protective layer is between the connection wiring and the additional connection wiring,
a second contact hole is defined in the inorganic protective layer to expose a portion of the connection wiring, and
the connection wiring is connected to the additional connection wiring through the second contact hole.

12. The display apparatus of claim 1, further comprising:
an inorganic insulating layer between the substrate and the connection wiring,
wherein an opening or a groove is defined in a portion of the inorganic insulating layer corresponding to the bending area.

13. The display apparatus of claim 1, further comprising:
an organic layer between the substrate and the connection wiring in the bending area.

14. The display apparatus of claim 1, further comprising:
an encapsulation layer on the substrate in the display area, wherein the encapsulation layer comprises a first inorganic encapsulation layer, an organic encapsulation layer and a second inorganic encapsulation layer, which are sequentially stacked one on another,
wherein the first inorganic encapsulation layer and the second inorganic encapsulation layer extend into the non-display area and contact the upper organic layer.

15. The display apparatus of claim 1, further comprising:
a bending protection layer on the upper organic layer in the bending area.

16. A display apparatus comprising:
a substrate including a display area, in which pixels are disposed and an image is displayed, and a non-display area surrounding the display area;
a data wiring on the substrate in the display area;
a connection wiring on the substrate in the non-display area, wherein the connection wiring comprises a same material as the data line;
an inorganic protective layer on the substrate covering the data line and extending to the non-display area; and
an upper organic layer on the substrate covering the connection wiring and at least a portion of the inorganic protection layer,
wherein the upper organic layer comprises a first upper organic layer, a second upper organic layer and a third upper organic layer, which are sequentially stacked one on another all above the inorganic protection layer, and
the second upper organic layer in a side of the upper organic layer, which is adjacent to the display area, has a bottom surface defining the second upper organic layer which is a closest facing surface to the substrate and is in direct contact with the inorganic protective layer, and
the third upper organic layer exposes an end of the second upper organic layer in the side of the upper organic layer adjacent to the display area.

17. The display apparatus of claim 16, further comprising:
an inner wiring and an outer wiring, which are spaced apart from each other in the non-display area; and
an intermediate insulating layer on the inner wiring and the outer wiring,
wherein a first contact hole is defined in the intermediate insulating layer, and
the connection wiring is connected to the inner wiring or the outer wiring through the first contact hole.

18. The display apparatus of claim 17, wherein the connection wiring electrically connects the inner wiring with the outer wiring.

19. The display apparatus of claim 17, wherein the inorganic protective layer covers at least a portion of the first contact hole.

20. The display apparatus of claim 17, wherein the connection wiring overlaps at least one of the inner wiring and the outer wiring, and has an island shape.

21. The display apparatus of claim 20, further comprising:
an additional connection wiring on the inorganic protective layer,
wherein a second contact hole is defined in a portion of the inorganic protective layer corresponding to the connection wiring, and
the additional connection wiring is connected to the connection wiring through the second contact hole.

* * * * *